(12) United States Patent
Yang et al.

(10) Patent No.: US 11,476,316 B2
(45) Date of Patent: Oct. 18, 2022

(54) PIXEL, A DISPLAY DEVICE INCLUDING SAME, AND A METHOD FOR MANUFACTURING THE DISPLAY DEVICE

(71) Applicant: SAMSUNG DISPLAY CO., LTD., Yongin-si (KR)

(72) Inventors: Tae Hoon Yang, Yongin-Si (KR); Ki Bum Kim, Yongin-Si (KR); Jong Chan Lee, Yongin-Si (KR); Woong Hee Jeong, Yongin-Si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/290,847

(22) PCT Filed: Apr. 30, 2019

(86) PCT No.: PCT/KR2019/005229
§ 371 (c)(1),
(2) Date: May 3, 2021

(87) PCT Pub. No.: WO2020/091165
PCT Pub. Date: May 7, 2020

(65) Prior Publication Data
US 2021/0391403 A1    Dec. 16, 2021

(30) Foreign Application Priority Data

Nov. 2, 2018    (KR) .................. 10-2018-0133532

(51) Int. Cl.
*H01L 27/32* (2006.01)
*H01L 51/56* (2006.01)
(Continued)

(52) U.S. Cl.
CPC ....... *H01L 27/3262* (2013.01); *G09G 3/3233* (2013.01); *H01L 51/56* (2013.01);
(Continued)

(58) Field of Classification Search
CPC ............. H01L 27/3262; H01L 27/3276; H01L 29/125; H01L 29/12; H01L 29/122; G09G 3/3233; G09G 3/3258; G09G 3/3291
See application file for complete search history.

(56) References Cited

U.S. PATENT DOCUMENTS 9,871,082 B2   1/2018   Jeon
9,871,106 B2   1/2018   Avci et al.
(Continued)

FOREIGN PATENT DOCUMENTS

CN   103606351    4/2016
KR   10-0662981   12/2006
(Continued)

OTHER PUBLICATIONS

International Search Report issued in corresponding application No. PCT/KR2019/005229 dated Aug. 8, 2019.
(Continued)

*Primary Examiner* — Sardis F Azongha
(74) *Attorney, Agent, or Firm* — F. Chau & Associates, LLC

(57) ABSTRACT

A pixel including: a light emitting element; a first transistor between a first node and the light emitting element to control current flowing from a first driving power source through the light emitting element to a second driving power source; a second transistor between a data line and the first transistor, and tamed on by a first scan signal; a third transistor between the first transistor and first node, and turned on by the first scan signal; and a fourth transistor between an initialization power line and the first node, and turned on by a second scan signal, wherein the fourth transistor is a tunneling field effect transistor including a source and drain area that are spaced apart from each other and have opposite conductivities, a channel area between the source area and drain area, and a (Continued)

gate electrode on the channel area with a gate insulating layer therebetween.

23 Claims, 26 Drawing Sheets

(51) Int. Cl.
 *G09G 3/3233* (2016.01)
 *H01L 27/12* (2006.01)
(52) U.S. Cl.
 CPC ........... *G09G 2300/0426* (2013.01); *G09G 2300/0809* (2013.01); *G09G 2330/02* (2013.01); *H01L 27/1251* (2013.01); *H01L 2227/323* (2013.01)

(56) References Cited

U.S. PATENT DOCUMENTS

| | | | |
|---|---|---|---|
| 10,002,974 | B2 | 6/2018 | Eguchi et al. |
| 10,062,323 | B2 | 8/2018 | Cho |
| 10,388,794 | B2 | 8/2019 | Lee et al. |

FOREIGN PATENT DOCUMENTS

| | | |
|---|---|---|
| KR | 10-2014-0092682 | 7/2014 |
| KR | 10-2016-0100927 | 8/2016 |
| KR | 10-2017-0026773 | 3/2017 |
| KR | 10-2017-0001887 | 5/2017 |
| KR | 10-2017-0055031 | 5/2017 |
| KR | 10-1797882 | 11/2017 |

OTHER PUBLICATIONS

Saurabh A. Mookerjea, "Band-to-Band Tunneling Field Effect Transistor for Low Power Logic and Memory Applications: Design, Fabrication and Characterization", A Dissertation in Electrical Engineering, The Pennsylvania State University The Graduate School Department of Electrical Engineering, Dec. 2010, pp. 1-145.

Alan C. Seabaugh et al., "Low-Voltage Tunnel Transistors for Beyond CMOS Logic", Proceedings of the IEEE vol. 98, No. 12, Dec. 2010, pp. 2095-2110.

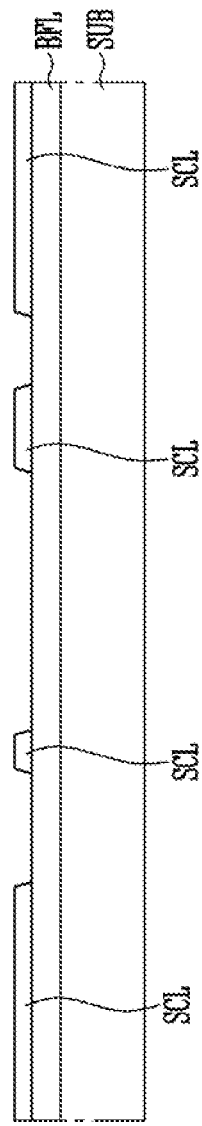

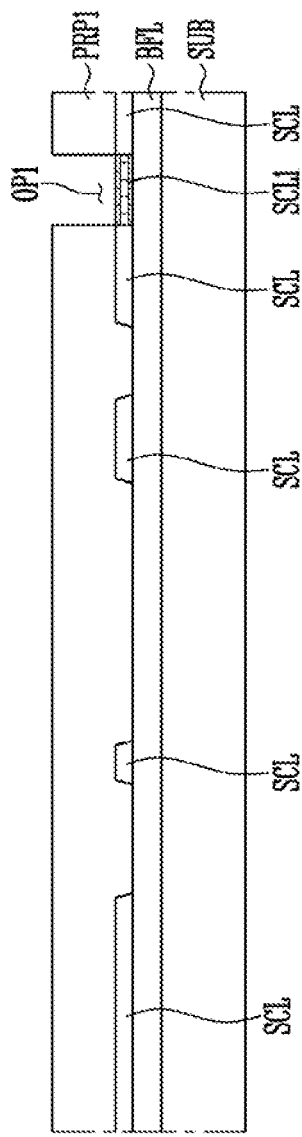

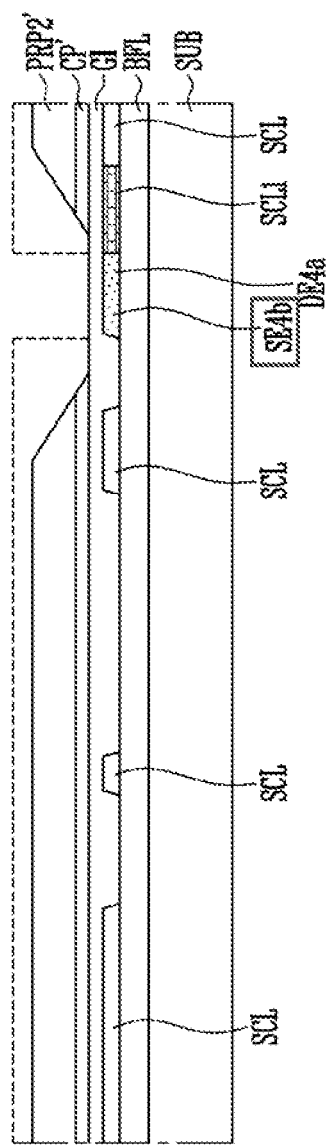

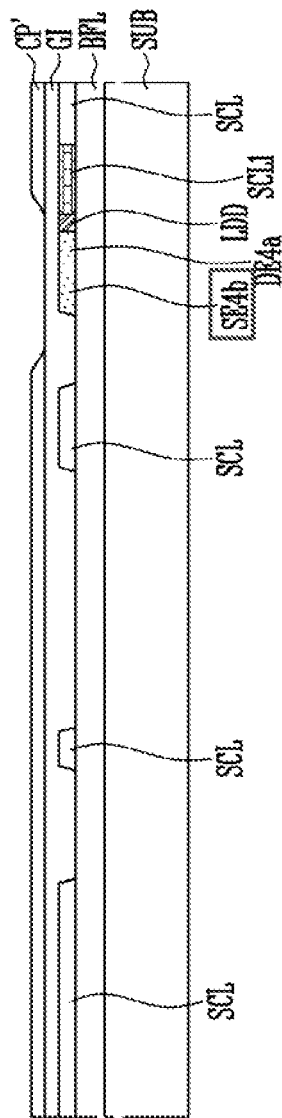

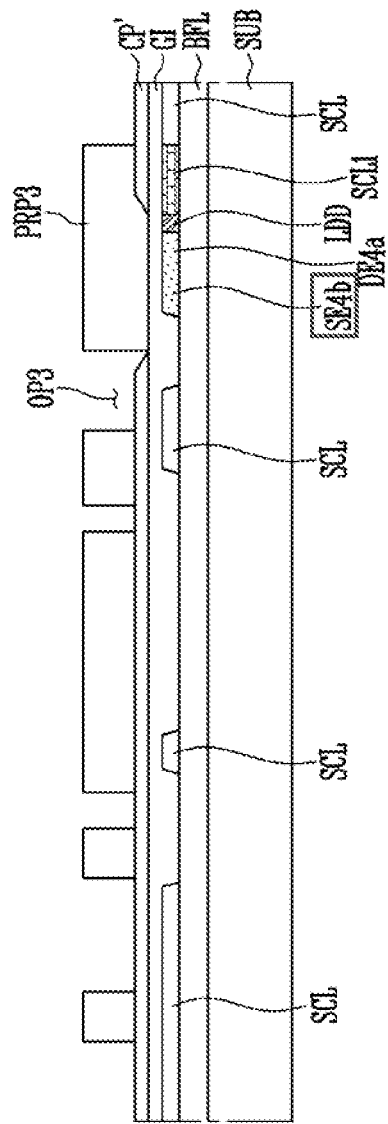

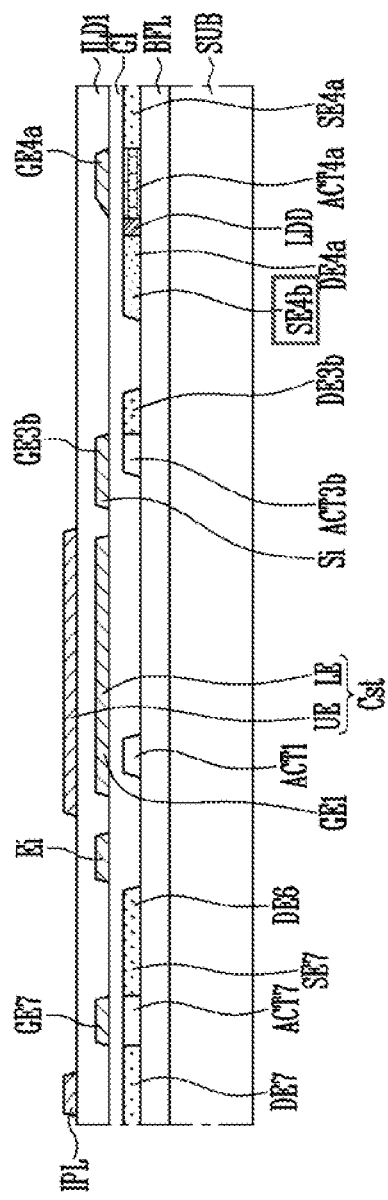

PIXEL, A DISPLAY DEVICE INCLUDING SAME, AND A METHOD FOR MANUFACTURING THE DISPLAY DEVICE

CROSS-REFERENCE TO RELATED APPLICATIONS

This application claims priority to PCT Application No. PCT/KR2019/005229 filed Apr. 30, 2019 which claims priority to Korean Patent Application No. 10-2018-0133532 filed Nov. 2, 2018, the disclosures of which are incorporated by reference herein in their entireties.

TECHNICAL FIELD

Various embodiments of the present disclosure relate to a pixel, and more particularly, to a pixel, a display device including the pixel, and a method of manufacturing the display device.

DISCUSSION OF RELATED ART

A display device is an output device for presentation of information in visual form. As portable information media use increases, demand for high resolution display devices is increasing.

In developing high resolution display devices the size of a pixel is gradually reduced. However, the reliability of the display device may be degraded as components of the pixel circuit shrink.

SUMMARY

An embodiment of the present disclosure provides a pixel including: a light emitting element; a first transistor connected between a first node and the light emitting element to control current flowing from a first driving power source through the light emitting element to a second driving, power source; a second transistor connected between a data line and the first transistor, and turned on oar in response to a first scan signal; a third transistor connected between the first transistor and the first node, and turned on in response to the first scan signal; and a fourth transistor connected between an initialization power line and the first node, and turned on in response to a second scan signal, wherein the fourth transistor is a tunneling field effect transistor comprising a source area and a drain area that are spaced apart from each other and have opposite conductivities, a channel area provided between the source area and the drain area, and a gate electrode provided on the channel area with a gate insulating layer interposed therebetween.

The source area of the fourth transistor may it p-type impurities, and the drain area of the fourth transistor may include n-type impurities.

The fourth transistor may include a lightly doped region provided between the drain area and the channel area, and the lightly doped region may include n-type impurities having a concentration lower than that of the drain area.

The gate electrode of the fourth transistor may include a lower surface provided on the gate insulating layer, an upper surface facing the lower surface, and first and second side surfaces coupling the lower surface and the upper surface to each other, the first side surface may extend from a boundary point between the lightly doped region and the channel area to a first side of the upper surface with a first inclination, and the second side surface may extend from a boundary point between the channel area and the source area to a second side of the upper surface with a second inclination, and the first inclination and the second inclination may be different from each other.

The second inclination may be greater than the first inclination.

The gate insulating layer may include a first part corresponding to the drain area and the lightly doped region, and a second part corresponding to the channel area and the source area, and the second part may be thicker than the first part.

The third transistor may be a tunneling field effect transistor.

The pixel may further include: a fifth transistor connected between the first node and the first driving power source, and turned off when an emission control signal is supplied to an emission control line; a sixth transistor connected between the first transistor and the light emitting element, and turned off when the emission control signal is supplied to the emission control line; and a seventh transistor connected between the initialization power line and the light emitting element.

The first, second, third, fifth, sixth and seventh transistors may be P-type thin film transistors.

An embodiment of the present disclosure provides a display device including: a substrate including a display area and a non-display area; pixels coupled to scan lines, emission control lines, and data lines, and located in the display area, of the substrate; and a driver configured to drive the scan lines, the emission control lines, and the data lines, wherein at least one pixel among, the pixels includes: a light emitting element; a first transistor connected between a first node and the light emitting element to control current flowing from a first driving power source through the light emitting element to a second driving power source; a second transistor connected between a data line and the first transistor, and turned on in response to first scan signal; a third transistor connected between the first transistor and the first node, and turned on in response to the first scan signal; and a fourth transistor connected between an initialization power line and the first node, and turned on in response to a second scan signal, wherein the fourth transistor is a tunneling field effect transistor comprising a source area and a drain area that are spaced apart from each other and have opposite conductivities, a channel area provided between the source area and the drain area, and a gate electrode provided on the channel area with a gate insulating layer interposed therebetween.

An embodiment of the present disclosure provides a method of manufacturing a display device including: forming a semiconductor pattern on a substrate, and then forming a channel area of at least one transistor in the semiconductor pattern; sequentially stacking a gate insulating layer and a conductive layer on the semiconductor pattern; forming a first photosensitive pattern including a first opening on the conductive layer, and then removing a portion of the conductive layer corresponding to the first opening to form a conductive pattern and expose a portion of the gate insulating layer; doping a first concentration of n-type impurities using the first photosensitive pattern and the conductive pattern as a mask to form a first doping area adjacent to a first side of the channel area in the semiconductor pattern; removing each of the first photosensitive pattern and the conductive pattern by performing an aching process, and then doping an area of the semiconductor pattern adjacent to the first doping area with a second concentration of n-type impurities to form a second doping area adjacent to the first doping area; forming a second photosensitive pattern that covers the first and second doping areas and a portion of the conductive pattern adjacent to the second doping area, and then patterning the portion of the conductive pattern using the second photosensitive pattern as a mask to form a gate pattern; and doping a first concentration of p-type impurities using the second photosensitive pattern and the gate pattern as a mask to form a third doping area adjacent to a second side of the channel area in the semiconductor pattern.

The gate pattern may include a gate electrode of the transistor including a lower surface in contact with the gate insulating layer, an upper surface facing the lower surface, and first and second side surfaces coupling the lower surface and the upper surface to each other, the first side surface may extend from a boundary point between the second doping area and the channel area to a first side of the upper surface with a first inclination, and the second side surface may extend from a boundary point between the channel area and the third doping area to a second side of the upper surface with a second inclination, and the first inclination and the second inclination may be different from each other, and the second inclination may be greater than the first inclination.

In the aching process, a portion of the exposed gate insulating layer may be partially etched, so that a thickness of the gate insulating layer corresponding to the first, doping area is different from that of the gate insulating layer corresponding to the third doping area.

The transistor may be a tunneling field effect transistor including the first doping area and the third doping area that are spaced apart from each other and have opposite conductivities, the channel area, the second doping area formed between the first doping area and the channel area, and the gate electrode formed on the channel area with the gate insulating layer interposed therebetween.

An embodiment of the present disclosure provides a pixel including: a light emitting element; a first transistor connected between a first node and the tight emitting element to provide a current from a first driving power source to the light emitting element; a second transistor connected between a data line and the first transistor, and connected to a first scan line; a third transistor connected between the first transistor and the first node, and connected to the first scan line; and a fourth transistor connected between an initialization power line and the first node, and connected to a second scan line, wherein the fourth transistor is a tunneling, field effect transistor.

A thickness of a gate insulating layer on a first electrode of the fourth transistor may be less than a thickness of the gate insulating layer on a second electrode of the fourth transistor.

A gate insulating layer may be disposed between a gate electrode and a channel area of the fourth transistor, the gate electrode having first and second sides with different slopes.

The first slope may be less an the second slope.

BRIEF DESCRIPTION OF THE DRAWINGS

FIGS. 10A, 10B, 10C, 10D, 10E, 10F, 10G, 10H, 10I, 10J, 10K, 10L, 10M, 10N, and 10O are sectional views sequentially illustrating a method of manufacturing the display device shown in FIG. 7.

DETAILED DESCRIPTION OF THE EMBODIMENTS

Figure 1:
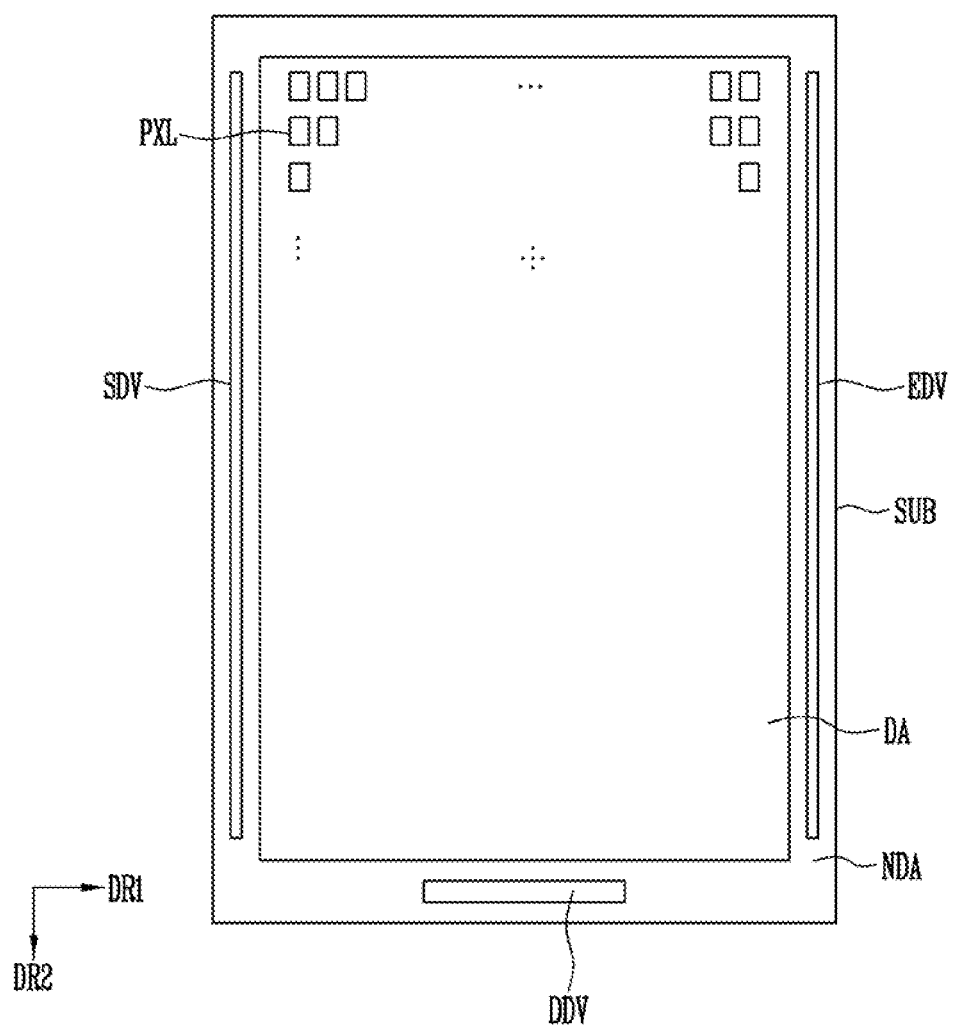
FIG. 1 is a plan view illustrating a display device in accordance with an embodiment of the present disclosure.

Hereinafter, particular embodiments of the present disclosure will be illustrated in the drawings and described in detail in the written description. However, the present disclosure is not limited thereto. For example, the present disclosure may be embodied in many different forms.

Like reference numerals may refer to like parts throughout the various figures and embodiments of the present disclosure. The sizes of elements in the accompanying drawings may be exaggerated for clarity of illustration. In the present disclosure, the singular forms are intended to include the plural forms as well, unless the context clearly indicates otherwise.

Furthermore, when a first part such as a layer, a film an area, or a plate is disposed on a second part, the first part may be not only directly on the second part but a third part may intervene between them.

Hereinafter, embodiments of the present disclosure will be described in detail with reference to the accompanying drawings.

FIG. 1 is a plan view illustrating a display device in accordance with an embodiment of the present disclosure.

Referring to FIG. 1, the display device in accordance with the present embodiment may include a substrate SUB, pixels PXL which are provided on the substrate SUB, a driver which is provided on the substrate SUB and configured to drive the pixels and a line component which couples the pixels PXL with the driver.

The substrate SUB may include a display area DA and a non-display area NDA. The display area DA may be an area in which the pixels PXL for displaying an in age are provided. Each pixel PXL will be described later herein. The non-display area NDA may be an area in which the driver for driving the pixels PXL and some of the lines for coupling the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line. In an embodiment of the present disclosure, there will be described an example in which the display area DA is provided as a single area having a rectangular shape including linear sides.

The non-display area NDA may be provided on at least one side of the display area DA. In an embodiment of the present disclosure, the non-display area NDA may enclose the perimeter of the display area DA.

The pixels PXL may be provided in the display area DA on the substrate SUB, and be connected to the lines. Each pixel PXL may be a minimum unit for displaying an image, and a plurality of pixels PXL may be provided.

The pixels PXL may include a light emitting element that emits white light and/or color light, and a pixel circuit that drives the light emitting element. The pixel circuit may include at least one transistor coupled to the light emitting element.

Each pixel PXL may emit light having any one color among red, green, and blue, and it is not limited thereto. For example, each of the pixels PXL may emit light having any one color among cyan, magenta, yellow, and white.

The plurality of pixels PXL may be arranged along rows extending in a first direction DR1 and columns extending in a second direction DR2 intersecting with the first direction DR1. However, the arrangement of the pixels PXL is not limited to a particular arrangement. In other words, the pixels PXL may be arranged in various forms.

The driver may provide a signal to each pixel PXL through the line component and thus control the operation of each pixel PXL. In FIG. 1, the line component is omitted. The line component be described later herein.

The drivers may include a scan driver SDV configured to provide scan signals to the pixels PXL through scan lines, an emission driver EDV configured to provide emission control signals to the pixels PXL through emission control lines, a data driver DDV configured to provide data signals to the pixels PXL through data lines, and a timing controller. The timing controller may control the scan driver SDV, the emission driver EDV and the data driver DDV.

In an embodiment of the present disclosure, the scan driver SDV, the emission driver EDV, and the data driver DDV may be disposed in the non-display area NDA of the substrate SUB. The location of the scan driver SDV, the emission driver EDV, and/or the data driver DDV may be changed as necessary. For example, the data driver DDV may be located at the other side of the display area. DA, of the scan driver SDV and the emission driver EDV may be located on the same side of the display area DA.

Figure 2:
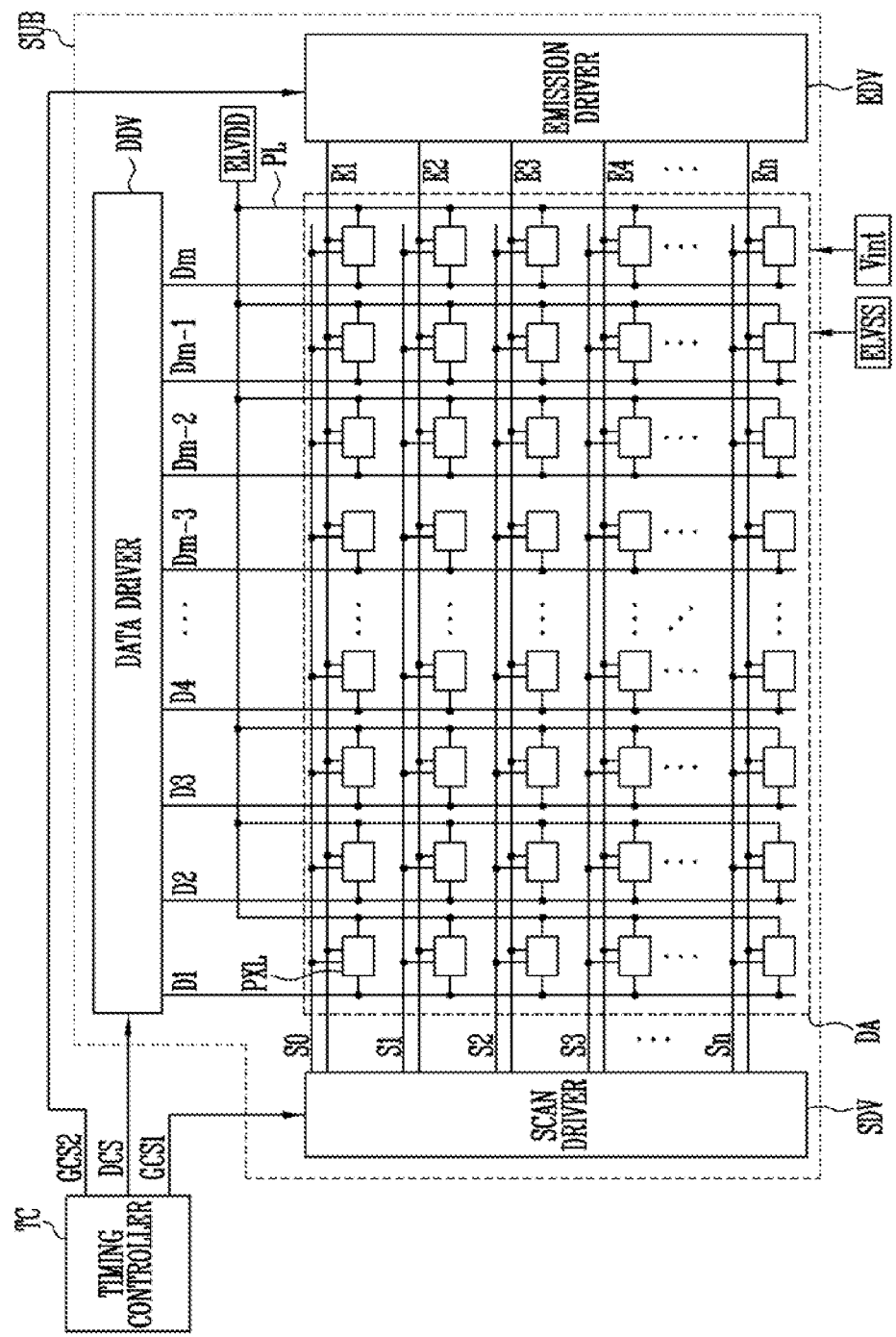
FIG. 2 is a block diagram illustrating pixels and a driver in the display device of FIG. 1.

FIG. 2 is a block diagram illustrating pixels and a driver in the display device of FIG. 1.

Referring to FIGS. 1 and 2, the display device in accordance with an embodiment of the present disclosure may include the pixels PXL, the driver, and the line component.

The driver may include a scan driver SDV, an emission driver EDV, data driver DDV, and a timing controller TC.

The locations of the scan driver SDV, the emission driver EDV, the data driver DDV, and the timing controller TC shown in FIG. 2 are only for illustrative purposes, and they may be disposed at other locations in an actual display device.

The line component may include a scan line, a data line, an emission control line, a power line PL, and an initialization power line, which are disposed in the display area DA to provide a signal to each pixel PXL from the driver.

The scan line may include a plurality of scan lines S0 to Sn. The emission control line may include a plurality of emission control lines E1 to En, and the data line may include a plurality of data lines D1 to Dm.

The pixels may include a light emitting element that emits light, and a pixel circuit that drives the light emitting element. The pixel circuit may include at least one transistor to drive the light emitting element.

The pixels PXL may be provided in the display area DA. Each pixel PXL may receive a data signal from a corresponding data line when a scan signal is supplied from a corresponding scan line. Each pixel PXL supplied with the data signal may control current flowing from a first driving power source ELVDD provided through the power line PL to a second driving power source ELVSS via a light emitting element. Each pixel PXL may also be provided with an initialization power source Vint.

The scan driver SDV may apply scan signals to the scan lines S0 to Sn in response to a first gate control signal GCS1 from the timing controller TC. For example, the scan driver SDV may sequentially supply scan signals to the scan lines S0 to Sn. When the scan signals are sequentially supplied to the scan lines S0 to Sn, the pixels PXL may be sequentially selected on a horizontal line basis.

The emission driver EDV may apply emission control signals to the emission control lines E1 to En in response to a second gate control signal GCS2 from the timing controller TC. For example, the emission driver EDV may sequentially supply the emission control signals to the emission control lines E1 to En, The emission control signal may have a width greater than that of the scan signal. For instance, the emission control signal may be supplied to an i-th (i is a natural number) emission control line E1 such that the section of the emission control signal at least partially overlaps that of the scan signal supplied to an i−1-th scan line Si−1 and the scan signal supplied to an i-th scan line Si. In other words, when the emission control signal has a first level, the first level of the emission control signal may overlap the scan signal supplied to the i−1-th scan line Si−1 and the scan signal supplied to the i-th scan line Si.

In addition, the emission control signal may be set to a gate-off voltage (e.g., a high voltage) so that the transistors included in the pixels PXL may be turned off. The scan signal may be set to a gate-on voltage (e.g., a low voltage) so that the transistors included in the pixels PXL may be turned on.

The data driver DDS may supply data signals to the data lines D1 to Dm in response to a data control signal DCS. The data signals supplied to the data lines D1 to Dm may be supplied to pixels PXL selected by scan signals.

The timing controller TC may supply the first and second Late control signals GCS1 and GCS2 generated based on the timing signals supplied from an external device to the scan driver SDV and the emission driver EDV, and may supply the data control signal DCS to the data driver DDV.

Each of the first and second gate control signals GCS1 and GCS2 may include a start pulse and clock signals. The start pulse controls the timing of a first scan signal or a first emission control signal. Clock signals are used to shrift the start pulse.

The data control signal DCS includes a source start pulse and clock signals. The source start pulse controls a sampling start time of data, and the clock signals are used to control a sampling operation.

Figure 3:
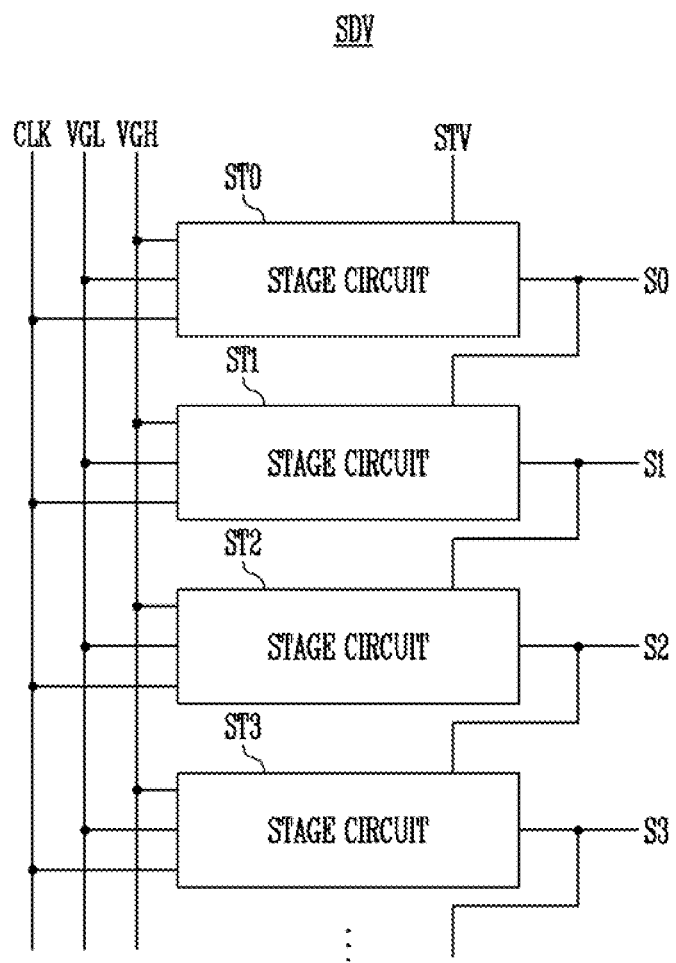
FIG. 3 is a diagram illustrating a scan driver of FIG. 2.

FIG. 3 is a diagram illustrating the scan driver of FIG. 2.

Referring to FIGS. 1 to 3, the scan driver SDV in accordance with an embodiment of the present disclosure includes a plurality of stage circuits ST0, ST1. ST2, ST3, . . . .

Each stage circuits ST0, ST1, ST2, ST3, . . . is coupled to a clock signal line CLK, a first power voltage line VGH, a second power voltage line VGL, a previous scan line, and a current scan line. Since no previous scan line exists, the first stage circuit ST0 is coupled to a start scan line STV.

A relatively high voltage is applied to the first power voltage line VGH, while a relatively low voltage is applied to the second power voltage line VGL. A pulsed voltage in which a high voltage and a low voltage alternate may be applied to the clock signal line CLK.

When the start pulse is applied through the start scan line STV coupled to the first stage circuit ST0, the first stage circuit ST0 outputs a scan signal generated by an internal operation to the scan line S0.

When the scan signal is applied through the previous scan line S0 coupled to the next stage circuit ST1, the next stage circuit ST1 outputs a scan signal generated by an internal operation to the scan line S1.

This operation is repeatedly performed by the next stage circuits ST2, ST3.

Since the stage circuits ST0, ST1, ST2, ST3, . . . , have substantially the same internal structure, an i-th stage circuit will be described below as a representative example of the stage circuits ST0, ST1, ST2, ST3.

Figure 4:
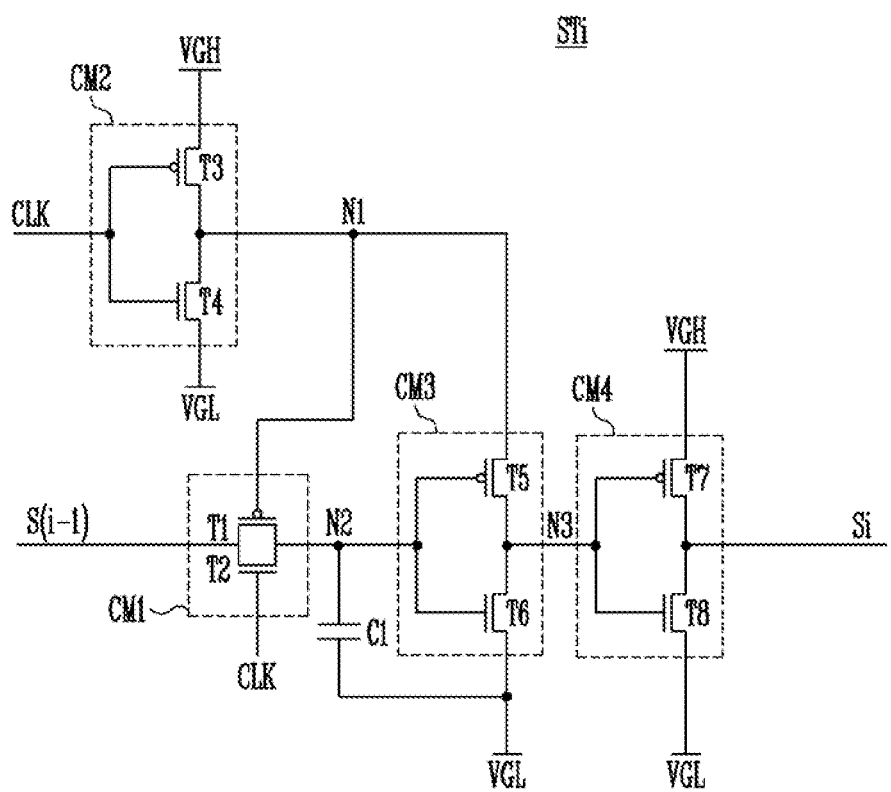
FIG. 4 is a circuit diagram illustrating a scan stage circuit of FIG. 3.

FIG. 4 is a circuit diagram illustrating a scan stage circuit of FIG. 3.

Referring to FIGS. 1 to 4, the i-th stage circuit STi (hereinafter, referred to as a 'stage circuit') in accordance with an embodiment of the present disclosure includes a first circuit component CM1, a second circuit component CM2, a third circuit component CM3, a fourth circuit component CM4, and a first capacitor C1.

The first circuit component CM1 has a control terminal coupled to a first node N1, and electrically connects or disconnects a previous scan line S(i−1) of the previous stage circuit to or from a second node N2 in response to a control signal. Here, the control terminal of the first circuit component CM1 is a gate electrode of transistor T1.

The first circuit component CM1 may include a first transistor T1 and a second transistor T2. A first electrode of the first transistor T1 may be coupled to the previous scan line S(i−1), a second electrode of the first transistor T1 may be coupled to the second node N2, and a gate electrode of the first transistor T1 may be coupled to the first node N1. A first electrode of the second transistor T2 may be coupled to the previous scan line S(i−1), a second electrode of the second transistor T2 may be coupled to the second node N2, and a gate electrode of the second transistor T2 may be coupled to a clock signal line CLK. The first transistor T1 may be set as a P-type transistor, and the second transistor T2 may be set as an N-type transistor.

The term "P-type transistor" refers to transistors in which the amount of flowing current increases when a voltage difference between a gate terminal and a source terminal increases in a negative direction. The term "N-type transistor" refers to transistors m which the amount of flowing current increases when a voltage difference between a gate terminal and a source terminal increases in a positive direction. Each transistor may be configured in various forms such as a thin film transistor (TFT), a field effect transistor (FET), and a bipolar junction transistor (BJT). In this embodiment, the circuit component may be a complementary metal-oxide-semiconductor (CMOS) circuit component including at least one P-type transistor and at least one N-type transistor. In other words, the first to fourth circuit components CM1 to CM4 may be CMOS circuit components. When the polarity of the required scan signal is opposite, or depending on other uses, the types of transistors included in each circuit component may be replaced with each other. For example, the first transistor T1 of the first circuit component CM1 may be the N-type transistor, and the second transistor T2 may be the P-type transistor. Here, the polarities of the first power voltage, the second power voltage, and the clock signal may also be changed as needed. Such a description may be applied to the following configuration, and redundant descriptions may be omitted below.

The second circuit component CM2 is coupled at a control terminal thereof to the clock signal line CLK, and couples either of the first power voltage line VGH or the second power voltage line VGL to the first node N1 in response to a control signal.

The second circuit component CM2 may include a third transistor T3 and a fourth transistor T4. A first electrode of the third transistor T3 may be coupled to the first power voltage line VGH, a second electrode of the third transistor T3 may be coupled to the first node N1, and a gate electrode of the third transistor T3 may be coupled to the clock signal line CLK. A first electrode of the fourth transistor T4 may be coupled to the second power voltage line VGL, a second electrode of the fourth transistor T4 may be coupled to the first node N1, and a gate electrode of the fourth transistor T4 may be coupled to the clock signal line CLK. The second electrode of the third transistor T3 and the second electrode of the fourth transistor T4 may be connected to each other. The third transistor T3 may be the P-type transistor, and the fourth transistor T4 may be the N-type transistor.

The third circuit component CM3 is coupled at a control terminal thereof to the second node N2, and couples either of the first node N1 or the second power voltage line VGL to the third node N3 in response to a control signal.

The third circuit component CM3 may include a fifth transistor T5 and a sixth transistor T6. A first electrode of the fifth transistor T5 may be coupled to the first node N1, a second electrode of the fifth transistor T5 may be coupled to the third node N3, and a gate electrode of the fifth transistor T5 may be coupled to the second node N2. A first electrode of the sixth transistor T6 may be coupled to the second power voltage line VGL a second electrode of the sixth transistor T6 may be coupled to the third node N3, and a gate electrode of the sixth transistor T6 may be coupled to the second node N2. The second electrode of the fifth transistor T5 and the second electrode of the sixth transistor T6 may be connected to each other. The fifth transistor T5 may be the P-type transistor, and the sixth transistor T6 may be the N-type transistor.

The fourth circuit component CM4 is coupled at a control terminal thereof to the third node N3, and couples either of the first power voltage line VGH or the second power voltage line VGL to a current scan line Si in response to a control signal.

The fourth circuit component CM4 may include a seventh transistor T7 and an eighth transistor T8. A first electrode of the seventh transistor T7 may be coupled to the first power voltage line a second electrode of the seventh transistor T7 may be coupled to the current scan line Si, and a gate electrode of the seventh transistor T7 may be coupled to the third node N3. A first electrode of the eighth transistor T8 may be coupled to the second power voltage line VGL, second electrode of the eighth transistor T8 may be coupled to the current scan line Si, and a gate electrode of the eighth transistor T8 may be coupled to the third node N3. The second electrode of the seventh transistor T7 and the second electrode of the eighth transistor T8 may be connected to each other. The seventh transistor T7 may be the P-type transistor, and the eighth transistor T8 may be the N-type transistor.

The first capacitor C1 couples the control terminal of the third circuit component CM3 to the second power voltage line VGL. For example, a first electrode of the first capacitor C1 may be coupled to the second node N2, and a second electrode thereof may be coupled to the second power voltage line VGL.

As described above, the i-th stage circuit STi may include a CMOS circuit component including at least one P-type transistor and at least one N-type transistor.

Figure 5:
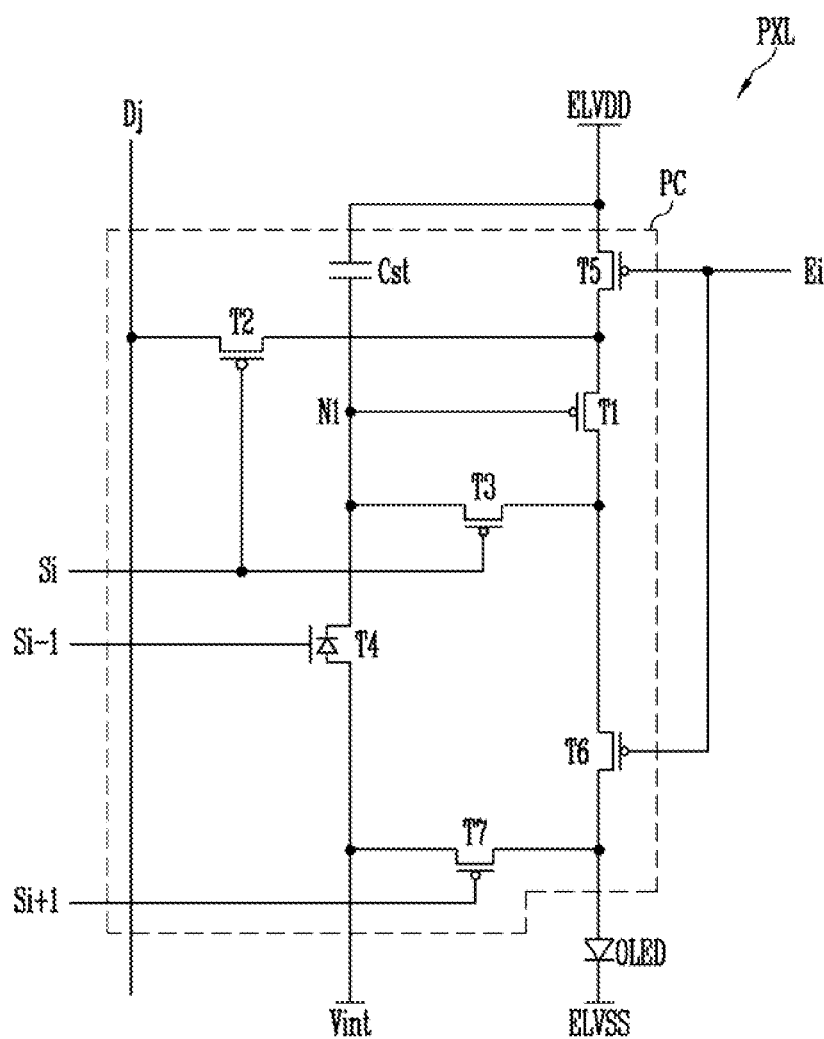
FIG. 5 is an equivalent circuit diagram illustrating one of the pixels shown in FIG. 2.

FIG. 5 is an equivalent circuit diagram illustrating one of the pixels shown in FIG. 2.

For convenience of explanation, there is illustrated in FIG. 5 one pixel PXL that is coupled to a j-th data line Dj, an i−1-th scan line Si−1, in i-th scan line Si, and an i+1-th scan line Si+1.

Referring to FIGS. 1 to 5, the pixel PXL in accordance with an embodiment of the present disclosure may include a light emitting element OLED, and a pixel circuit PC coupled to the light emitting element OLED to drive the light emitting element OLED. Here, the pixel circuit PC may include first to seventh transistors T1 to T7, and a storage capacitor Cst.

An anode electrode of the light emitting element OLED may be coupled to the first transistor T1 via the sixth transistor T6. A cathode electrode of the light emitting element OLED may be coupled to the second driving power source ELVSS.

The light emitting element OLED may emit light having a predetermined luminance corresponding to current supplied from the first transistor T1. The voltage of the first driving power source ELVDD to be applied to the power line PL may be set to a voltage higher than that of the second driving power source ELVSS to allow current to flow to the light emitting element OLED.

A source electrode of the first transistor T1 is coupled to the first driving power source ELVDD via the fifth transistor T5, and a drain electrode thereof is coupled to the anode electrode of the light emitting element OLED via the sixth transistor T6. In an embodiment of the present disclosure, the first transistor T1 may be the P-type transistor. The first transistor T1 may be a driving transistor.

Here, the first transistor T1 may control, in response to the voltage of the first node N1 that is applied to the gate electrode thereof, current flowing from the first driving power source ELVDD to the second driving power source ELVSS via the light emitting element OLED.

The second transistor T2 is connected between the j-th data line Dj and the source electrode of the first transistor T1. The gate electrode of the second transistor T2 is connected to the i-th scan line Si. In an embodiment of the present disclosure, the second transistor T2 may be the P-type transistor. The second transistor T2 may be a switching transistor.

When a scan signal is supplied to the i-th scan line Si, the second transistor T2 may be turned on to electrically connect the j-th data line Dj to the source electrode of the first transistor T1.

The third transistor T3 is connected between the drain electrode of the first transistor T1 and the first node N1. The gate electrode of the third transistor T3 is connected to the i-th scan line Si. The gate electrode of the third transistor T3 may also be connected to the gate electrode of the second transistor T2. In an embodiment of the present disclosure, the third transistor T3 may be the P-type transistor.

When a scan signal is supplied to the i-th scan line Si, the third transistor T3 may be turned on to electrically connect the drain electrode of the first transistor T1 to the first node N1. Therefore, when the third transistor T3 is turned on, the first transistor T1 is connected in the form of a diode.

The fourth transistor T4 is connected between the first node N1 and the initialization power source Vint. The gate electrode of the fourth transistor T4 is coupled to the i−1-th scan line Si−1.

When a scan signal is supplied to the i−1-th scan line Si−1, the fourth transistor T4 is turned on to supply the voltage of the initialization power source Vint to the first node N1.

In an embodiment of the present disclosure, the fourth transistor T4 may be a tunneling field effect transistor. The tunneling field effect transistor is a switching device. In particular, the tunneling field effect transistor has to power and high energy efficiency by reducing a subthreshold swing (SS), and thus may improve switching characteristics (e.g. an ON/OFF ratio). Such a tunneling field effect transistor may have off current characteristics superior to those of the P-type transistor. The tunneling field effect transistor generally has an asymmetric structure in which a source area and a drain area are formed with impurities having opposite polarities on both sides of a channel area. A detailed description thereof will be described below with reference to FIG. 6.

When the fourth transistor T4 is the tunneling field effect transistor, a leakage current flowing from the first node N1 to the initialization power source Vint may be minimized, and thereby an image having a desired luminance may be displayed.

The fifth transistor T5 is connected between the first driving power source ELVDD and the source electrode of the first transistor T1. The gate electrode of the fifth transistor T5 may be coupled to the i-th emission control line Ei. In an embodiment of the present disclosure, the fifth transistor T5 may be the P-type transistor.

The fifth transistor is may be turned off when an emission control signal is supplied to the i-th emission control line Ei, and may be turned on in the other cases.

The sixth transistor T6 may be coupled between the drain electrode of the first transistor T1 and the anode electrode of the light emitting element OLED. The gate electrode of the sixth transistor T6 may be coupled to the i-th emission control line Ei. The sixth transistor T6 may be formed of the P-type transistor.

The sixth transistor T6 may be turned off when an emission control signal is supplied to the i-th emission control line Ei, and may be turned on in the other cases.

The seventh transistor T7 may be coupled between the initialization power source Vint and the anode electrode of the light emitting element OLED. The gate electrode of the seventh transistor T7 is coupled to the scan line Si+1.

When a scan signal is supplied to the i+1-th scan line Si+1, the seventh transistor T7 is turned on to supply the voltage of the initialization power source Vint to the anode electrode of the light emitting element OLED. In an embodiment of the present disclosure, the seventh transistor T7 may be the P-type transistor.

As described above, when the leakage current supplied from the anode electrode of the light emitting element OLED to the initialization power source Vint is minimized, the light emitting element OLED may generate light having a desired luminance.

The storage capacitor Cst may be coupled between the first driving power source ELVDD and the first node N1. The storage capacitor Cst may store a voltage corresponding to a data signal and a threshold voltage of the first transistor T1.

The initialization power source Vint may be set to a voltage lower that that of a data signal. When the voltage of the initialization power source Vint is supplied to the anode electrode of the light emitting element OLED, the parasitic capacitor of the light emitting element OLED may be discharged.

If the parasitic capacitor of the light emitting element OLED is discharged by the initialization power source Vint, the light emitting element OLED may be set to a non-emission state even if the leakage current is supplied from the first transistor T1. In other words, the leakage current from the first transistor T1 may pre-charge the parasitic capacitor of the light emitting element OLED, and thus, the parasitic capacitor of the light emitting element OLED may maintain the non-emission state.

As described above, the pixel in accordance with an embodiment of the present disclosure may include the fourth transistor T4 formed of a tunneling field effect transistor, the first to third transistors T1 to T3 formed of P-type transistors, and the fifth to seventh transistors T5 to T7 formed of P-type transistors. In an embodiment, the pixel PXL may form the third transistor T3 and/or the seventh transistor T7 together with the fourth transistor T4 as the tunneling field effect transistor.

Figure 6:
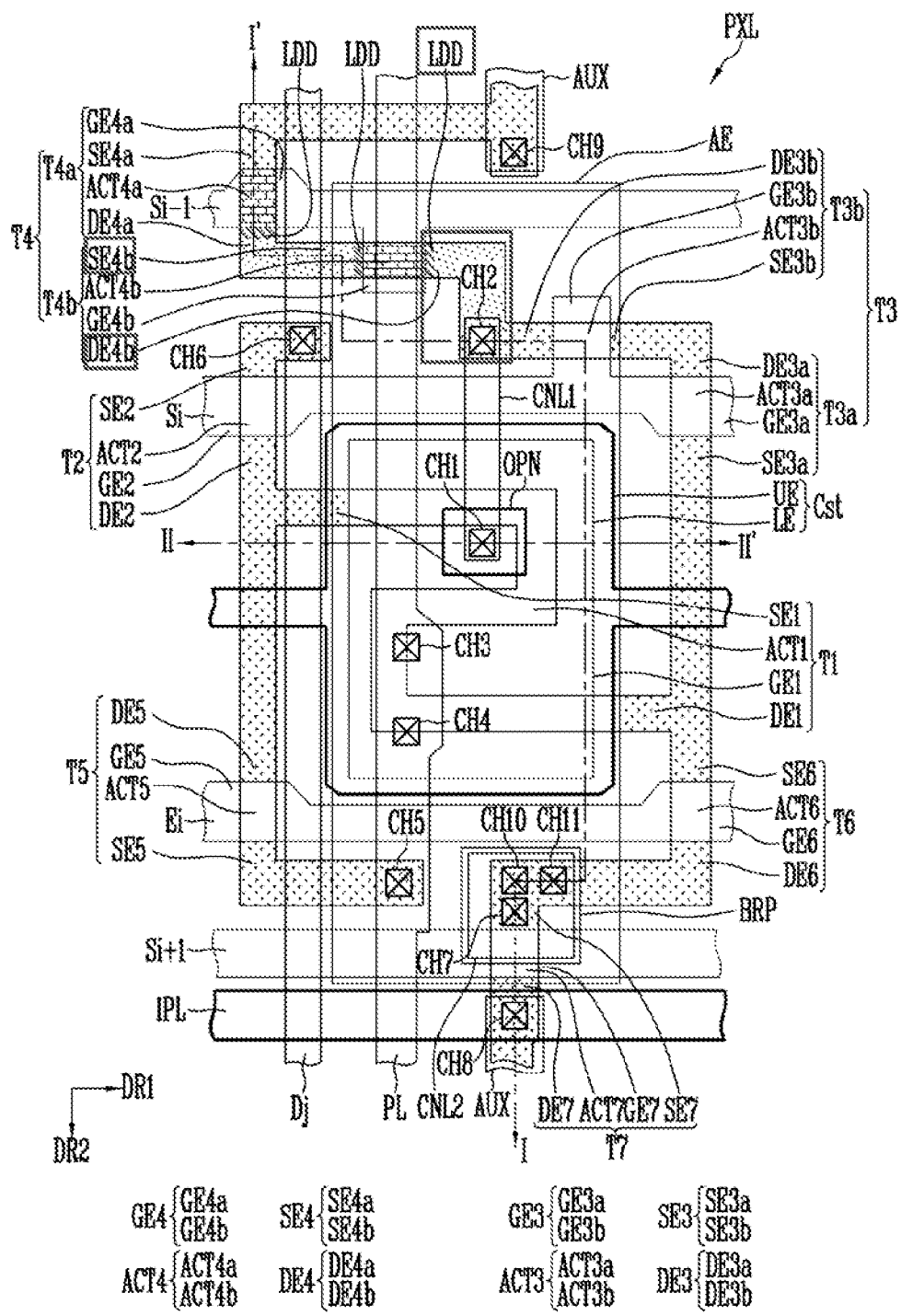
FIG. 6 is a plan view illustrating in detail one pixel shown in FIG. 5.
Figure 7:
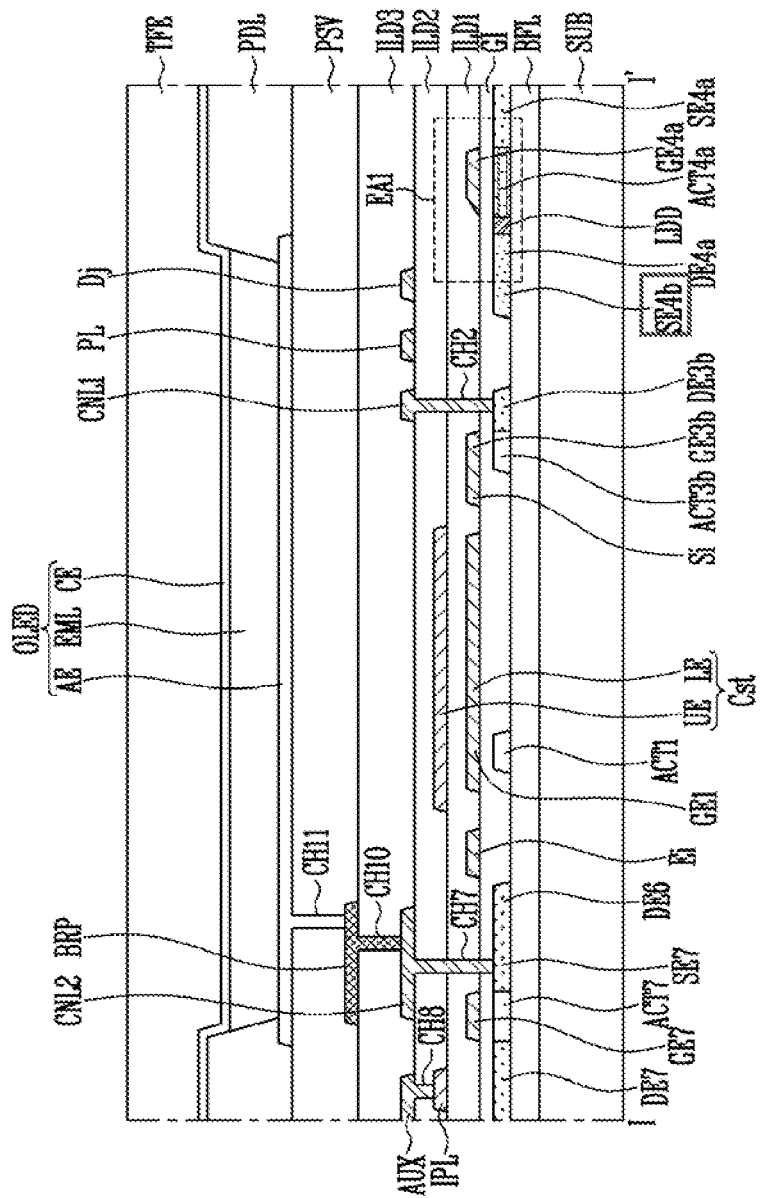
FIG. 7 is a sectional view taken along line I-I' of FIG. 6.
Figure 8:
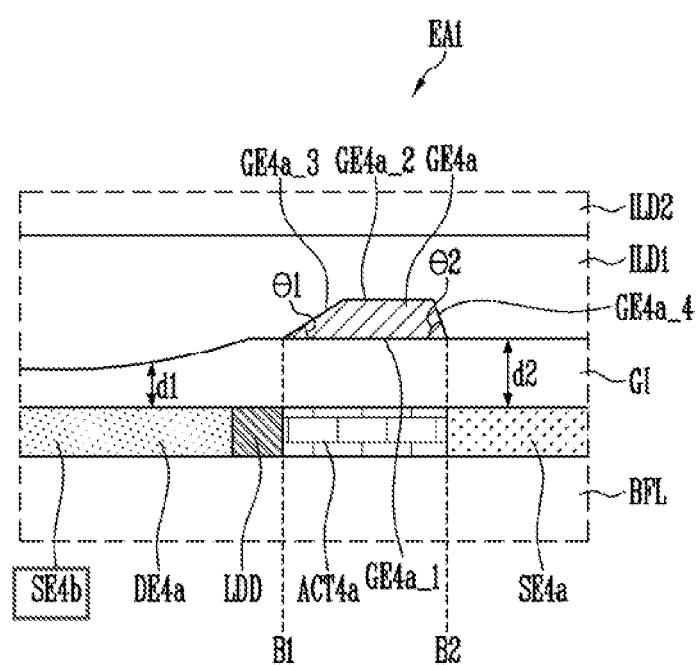
FIG. 8 is an enlarged sectional view of area EA1 of FIG. 7.
Figure 9:
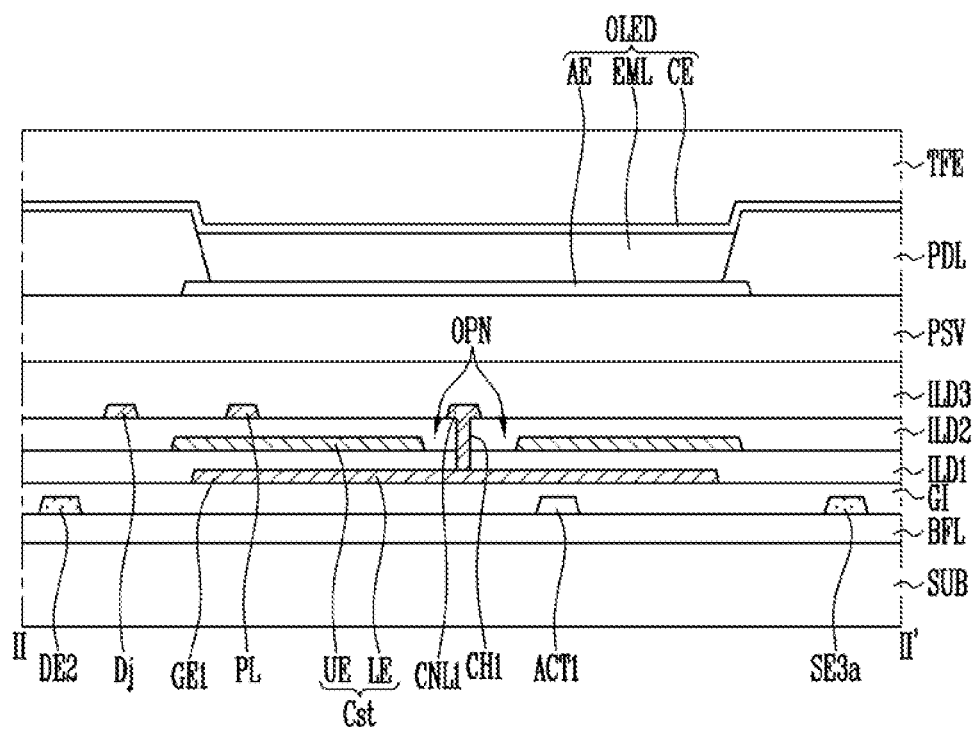
FIG. 9 is a sectional view taken along line II-II' of FIG. 6.

FIG. 6 is a plan view illustrating in detail one pixel shown in FIG. 5, FIG. 7 is a sectional view taken along line I-I' of FIG. 6, FIG. 8 is an enlarged sectional view of area EA1 of FIG. 7, and FIG. 9 is a sectional view taken along line II-II' of FIG. 6.

In FIGS. 6 to 9, based on a pixel PXL disposed on an i-th row and a j-th column provided in the display area DA, there are illustrated three scan lines Si−1, Si, and Si+1, an emission control line Ei, a power line PL, and a data line Dj which are coupled to the single pixel PXL.

In FIGS. 6 to 9, for the sake of description, a scan line of an i−1-th row may be referred to as "i−1-th scan line Si−1", a scan line of an i-th row may be referred to as scan line Si+1, a scan line of an i-+1-th row may be referred to as "i+1-th scan line Si+1", an emission control line of the i-th row may be referred to as "emission control line Ei", a data line of a j-th column may be referred to as "data line Dj", and a power line of a j-th column may be referred to as "power line PL".

Referring, to FIGS. 1 to 9, the display device in accordance with an embodiment of the present disclosure may include a substrate SUB, a line component, and a pixel PXL.

The substrate SUB may include transparent insulating material and thus may allow light to pass therethrough. Furthermore, the substrate SUB may be a rigid substrate or a flexible substrate.

Examples of the rigid substrate may include a glass substrate, a quartz substrate, a glass ceramic substrate, and a crystalline glass substrate.

Examples of the flexible substrate may include a film substrate and a plastic substrate, each of which includes polymer organic material. For example, the flexible substrate may include one of polyethersulfone (PES), polyacrylate, polyetherimide (PEI), polyethylene naphthalate (PEN), polyethylene terephthalate (PET), polyphenylene sulfide (PPS) polyarylate (PAR), polyimide (PI), polycarbonate (PC), triacetate cellulose (TAC), and cellulose acetate propionate (CAP). Furthermore, the flexible substrate may include fiber glass reinforced plastic (FRP).

For example, a material applied to the substrate SUB may have resistance e.g., thermal resistance) to high treatment temperatures during a process of fabricating the display device. In an embodiment of the present disclosure, the entirety or at least a portion of the substrate SUB may have flexibility.

The line component may provide a signal to the pixel PXL and include the scan lines Si−1, Si, and Si+1, the data line Dj, the emission control line Ei, the power line PL, and an initialization power line IPL.

The scan lines Si−1, Si, and Si+1 may extend in a first direction DR1. The scan lines Si−1, Si, and Si+1 may include the i−1-th scan line Si−1, the i-th scan line Si, and the i+1-th scan line Si+1 which are successively arranged in a second direction DR2 intersecting with the first direction DR1.

A scan signal may be supplied to each of the scan lines Si−1, Si, and Si+1. For example, the i−1-th scan signal may be supplied to the i−1-th scan line Si−1, the i-th scan signal may be supplied to the i-th scan line Si, and the i+1-th scan signal may be supplied to the i+1-th scan line Si+1.

The emission control line Ei may extend in the first direction DR1, and may be disposed between the i-th scan line Si and the i+1-th scan line Si+1 to be spaced apart from the i-th scan line Si and the i+1-th scan line Si+1, respectively. An emission control signal may be applied to the emission control line Ei.

The data lines Dj may extend in the second direction DR2 and be successively arranged in the first direction DR1. A data signal may be applied to the data line Dj.

The power line PL may extend in the second direction DR2. The power line PL may be disposed to be spaced apart from the data line Dj. The first driving power source ELVDD may be applied to the power line PL.

The initialization power line IPL may extend in the first direction DR1 The Initialization power line IPL may be provided between the i+1-th scan line Si+1 and the i−1-th scan line Si−1 of the pixel of the next row. The initialization power source Vint may be applied to the initialization power line IPL.

The pixel PXL may include a light emitting element OLED that emits light, and a pixel circuit PC that drives the light emitting element OLED. The pixel circuit PC may include first to seventh transistors T1 to T7, and a storage capacitor Cst.

In an embodiment of the present disclosure, the first to third transistors T1 to T3 and the fifth to seventh transistors T5 to T7 may be P-type transistors, and the fourth transistor T4 may be a tunneling field effect transistor.

The first transistor T1 may include a first gate electrode GE1, a first active pattern ACT1, a first source electrode SE1, a first drain electrode DE1, and a first connection line CNL1.

The first gate electrode GE1 may be coupled with a third drain electrode DE3 of the third transistor T3 and a fourth source electrode SE4 of the fourth transistor T4.

The first connection line CNL1 may couple the first gate electrode GE1, the third drain electrode DE3, and the fourth source electrode SE4 to each other. A first end of the first connection line CNL1 is coupled to the first gate electrode GE1 through a first contact hole CH1. A second end of the first connection line CNL1 may be coupled to the third drain electrode DE3 and the fourth source electrode SE4 through a second contact hole CH2. The first connection line CNL1 may be extended in the second direction DR2 from the first contact hole CH1 to the second contact hole CH2.

In an embodiment of the present disclosure, each of the first active pattern ACT1, the first source electrode SE1, and the first drain electrode DE1 may be formed of an undoped semiconductor layer or a semiconductor layer doped with an impurity. For example, each of the first source electrode SE1 and the first drain electrode DE1 may be formed of a semiconductor layer doped with an impurity. The first active pattern ACT1 may be formed of an undoped semiconductor layer. Here, the impurity may include a high concentration of p-type impurities. In an embodiment, the first active pattern ACT1 may be formed of a semiconductor layer doped with a low concentration of impurity.

The first active pattern ACT1 may have a bar shape, extending in a predetermined direction, and be bent several times along the longitudinal direction. The first active pattern ACT1 may, overlap with the first gate electrode GE1 in a plan view. Since the first active pattern ACT1 is relatively long, a channel area of the first transistor T1 may be relatively long.

Thus, a driving range of a gate voltage to be applied to the first transistor T1 may be increased. Consequently, the gray scale of light emitted from the light emitting element OLED may be precisely controlled.

The first source electrode SE1 may be coupled to a first end of the first active pattern ACT1. The first source electrode SE1 may be coupled with a second drain electrode DE2 of the second transistor T2 and a fifth drain electrode DE5 of the fifth transistor T5.

The first drain electrode DE1 may be coupled to a second end of the first active pattern ACT1. The first drain electrode DE1 may be coupled with a third source electrode SE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be coupled to the i-th scan line Si. The second gate electrode GE2 may be provided as a part of the i-th scan line Si or formed to have a shape protruding from the i-th scan line Si.

In an embodiment of the present disclosure, each of the second active pattern ACT2, the second source electrode SE2, and the second drain electrode DE2 may be formed of an undoped semiconductor layer or a semiconductor layer doped with an impurity.

For example, each of the second source electrode SE2 and the second drain electrode DE2 may be formed of a semiconductor layer doped with an impurity. The second active pattern ACT2 may be formed of an undoped semiconductor layer. The impurity may include a high concentration of p-type impurities.

The second active pattern ACT2 may correspond to a portion of the second transistor T2 that overlaps with the second gate electrode GE2. In an embodiment, the second active pattern ACT2 may be formed of a semiconductor layer doped with a low concentration of impurity.

A first end of the second drain electrode DE2 may be coupled with the second active pattern ACT2. A second end of the second drain electrode DE2 may be coupled to the first source electrode SE1 of the first transistor T1 and the fifth drain electrode DE5 of the fifth transistor T5. A first end the second source electrode SE2 may be coupled with the second active pattern ACT2. A second end of the second source electrode SE2 may be coupled to the data line Dj.

The third transistor T3 may have a double gate structure to prevent current leakage. In other words, the third transistor T3 may include a 3a-th transistor T3a, and a 3b-th transistor T3b.

The 3a-th transistor. T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, to 3b-th source electrode SE3b, and a 3b-th drain electrode DE3b.

In an embodiment of the present disclosure, for the convenience of description, the 3a-th gate electrode GE3a and the 3b-th gate electrode GE3b may be referred to as "third gate electrode GE3". The 3a-th active pattern ACT3a and the 3b-th active pattern ACT3b may be referred to as "third active pattern ACT3". The 3a-th source electrode SE3a and the 3b-th source electrode SE3b may be re erred to as "third source electrode SE3". The 3a-th drain electrode DE3a and the 3b-th drain electrode DE3b may be referred to as "third drain electrode DE3".

The third gate electrode GE3 may be coupled to the i-th scan line Si. The third gate electrode GE3 may be provided as a part of the i-th scan line Si or formed to have a shape protruding from the i-th scan line Si. In other words, the third gate electrode GE3 may be formed by the i-th scan line Si.

Each of the third active pattern ACT3, the third source electrode SE3, and the third drain electrode DE3 may be formed of an undoped semiconductor layer or a semiconductor layer doped with an impurity. For example, each of the third source electrode SE3 and the third drain electrode DE3 may be formed of a semiconductor layer doped with an impurity. The third active pattern ACT3 may be formed of an undoped semiconductor layer. Here, the third active pattern ACT3 may correspond to a portion of the third transistor T3 that overlaps with the third gate electrode GE3, and the impurity may contain a high concentration of p-type impurities. For example, the third active pattern ACT3 may be overlapped by the third gate electrode GE3, but the third active pattern ACT3 may not be overlapped by a portion of the i-th scan line Si. In an embodiment, the third active pattern. ACT3 may be formed of a semiconductor layer doped with a low concentration of impurity.

A first end of the third source electrode SE3 may be coupled to the third active pattern ACT3. A second end of the third source electrode SE3 may be coupled with the first drain electrode DE1 of the first transistor T1 and the sixth source electrode SE6 of the sixth transistor T6.

A first end of the third drain electrode DE3 may be coupled to the third active pattern ACT3. A second end of the third drain electrode DE3 may be coupled to the fourth source electrode SE4 of the fourth transistor T4. The third drain electrode DE3 may be coupled to the first gate electrode GE1 through the first connection line CNL1 and the first and second contact holes CH1 and CH2.

The fourth transistor T4 may have a double gate structure to prevent current leakage, similarly to the third transistor T3. In other words, the fourth transistor T4 may include a 4a-th transistor T4a and a 4b-th transistor T4b.

The 4a-th transistor T4a may include a 4a-th gate electrode GE4a, a 4a-th active pattern ACT4a, a 4a-th source electrode SE4a, and a 4a-th drain electrode DE4a. The 4b-th transistor T4b may include a 4b-th gate electrode GE4b, a 4b-th active pattern ACT4b, a 4b-th source electrode SE4b, and the 4b-th drain electrode DE4b. The 4a-th drain electrode DE4a and the 4b-th source electrode SE4a may be integral with each other In an embodiment of the present disclosure, for the convenience of description, the 4a-th gate electrode GE4a and the 4b-th gate electrode GE4b may be referred to as "fourth gate electrode GE4". The 4a-th active pattern ACT4a and the 4b-th active pattern ACT4b may be referred to as "fourth active pattern ACT4". The 4a-th source electrode SE4a may be referred to as "fourth source electrode SE4". The 4a-th drain electrode DE4a and the 4b-th drain electrode DE4b may be referred to as "fourth drain electrode DE4".

The fourth gate electrode GE4 may be coupled to the i−1-th scan line Si−1. The fourth gate electrode GE4 may be provided as a part of the i−1-th scan line Si−1 or formed to have a shape protruding from the i−1-th scan line Si−1. In other words, the fourth gate electrode GE4 may be formed by the i−1-th scan line Si−1.

Each of the fourth active pattern ACT4, the fourth source electrode SE4, and the fourth drain electrode DE4 may be formed of an undoped semiconductor layer or a semiconductor layer doped with an impurity. For example, each of the fourth source electrode SE4 and the fourth drain electrode DE4 may be formed of a semiconductor layer doped with an impurity. The fourth active pattern ACT4 may be formed of an undoped semiconductor layer. In an embodiment, the fourth active pattern ACT4 may be formed of a semiconductor layer doped with a to concentration of impurity.

The fourth active pattern ACT4 may correspond to a portion of the fourth transistor T4 that overlaps with the fourth gate electrode GE4, and may be a channel area of the fourth transistor T4. For example, the fourth active pattern ACT4 may be disposed between the fourth source electrode SE4 and the fourth drain electrode DE4 and overlapped by the fourth gate electrode GE4.

In an embodiment of the present disclosure, the fourth source electrode SE4 and the fourth drain electrode DE4 may be formed of semiconductor layers doped with opposite conductive impurities. For instance, a portion of the fourth source electrode SE4 may be formed of a semiconductor layer doped with a high concentration of p-type impurities, while a portion of the fourth drain electrode DE4 may be formed of a semiconductor layer doped with a high concentration of n-type impurities. In other words, the 4a-th source electrode SE4a may be formed of a semiconductor layer doped with a high concentration of p-type impurities, while the 4a-th and 4b-th drain electrodes DE4a and DE4b may be formed of a semiconductor layer doped with a high concentration of n-type impurities. In addition, the 4b-th source electrode SE4b may be formed of a semiconductor layer doped with a high concentration of n-type impurities. In this case, the 4a-th and 4b-th active patterns ACT4a and ACT4b may be formed of an intrinsic semiconductor layer that is not doped with impurities, or be formed of a semiconductor layer that is doped with a low concentration of p-type impurities.

A first end of the fourth drain electrode DE4 may be coupled to the fourth active pattern ACT4. In other words, the first end of the fourth drain electrode DE4 may be adjacent to the fourth active pattern ACT4. A second end of the fourth source electrode SE4 may be coupled to an initialization power line of the i−1-th pixel and the seventh drain electrode DE7 of the seventh transistor T7 of the i−1-th pixel.

An auxiliary connection line AUX may be provided between the fourth drain electrode DE4 and the initialization power line of the i−1-th pixel.

A first end of the auxiliary connection line AUX may be coupled with the 4a-th drain electrode DE4a through a ninth contact hole CH9. A second end of the auxiliary connection line AUX may be coupled to the initialization power line IPL of the pixel PXL disposed on the i−1-th row through an eighth contact hole CH8 of the pixel PXL disposed on the i−1-th row.

A first end of the fourth source electrode SE4 may be coupled to the fourth active pattern ACT4. A second end of the fourth source electrode SE4 may be coupled to the third drain electrode DE3 of the third transistor T3. For example, the 4b-th drain electrode may be coupled to the 3b-th drain electrode DE3b of the third drain electrode DE3 through the first connection line CNL1.

The 4b-th drain electrode DE4b may be coupled to the first gate electrode GE1 of the first transistor T1 through the first connection line CNL1 and the first and second contact holes CH1 and CH2.

The fourth transistor T4 may be formed of a tunneling field effect transistor including the fourth source electrode SE4 (or the 4a-th source electrode SE4a) formed of the semiconductor layer doped with a high concentration of p-type impurities, the fourth drain electrode DE4 (or the 4b-th drain electrode DE4b) formed of the semiconductor layer doped with a high concentration of n-type impurities, the fourth active pattern ACT4 formed of an intrinsic semiconductor layer or a semiconductor layer doped with a low concentration of p-type impurities, and the fourth gate electrode GE4 provided on the fourth active pattern ACT4 with a gate insulating layer GI interposed therebetween. The gate insulating layer GI disposed between a lower portion of the fourth transistor T4 including the fourth drain electrode DE4, the fourth active pattern ACT4 and the fourth gate electrode GE4 and an upper portion of the fourth transistor T4 may have a width that varies.

In the fourth transistor T4 formed of the tunneling field effect transistor, if an on voltage is applied to the fourth gate electrode GE4 and a reverse bias voltage is applied to each of the fourth source electrode SE4 and the fourth drain electrode DE4, a junction having an energy band gradient is formed between the fourth active pattern ACT4 corresponding to the channel area and the fourth source electrode SE4, so that a driving current generated by quantum mechanical tunneling flows.

When the fourth transistor T4 is in an off state, a barrier between the fourth source electrode SE4 and the fourth active pattern ACT4 is too wide, so that electrons of the fourth source electrode SE4 are not injected into the fourth active pattern ACT4. In other words, since electrons are not tunneled in the off state of the fourth transistor T4, only a very small leakage current exists. Consequently, since the fourth transistor T4 formed of the tunneling field effect transistor has excellent off-current characteristics, a leakage current flowing to the initialization power source Vint may be minimized.

The fifth transistor T5 may include a fifth gate electrode GE5, a fifth active pattern ACT5, a fifth source electrode SE5, and a fifth drain electrode DE5.

The fifth gate electrode GE5 may be coupled to the emission control line Ei. The fifth gate electrode GE5 may be provided as a part of the emission control line Ei, or formed to have a shape protruding from the emission control line Ei. In other words, the fifth gate electrode GE5 may be formed by the emission control line Ei.

Each of the fifth active pattern ACT5, the fifth source electrode SE5, and the fifth drain electrode DE5 may be formed of an undoped semiconductor layer or a semiconductor layer doped with the impurity. For example, each of the fifth source electrode SE5 and the fifth drain electrode DE5 may be formed of a semiconductor layer doped with an impurity. The fifth active pattern ACT5 may be formed of an undoped semiconductor layer. Here, the impurity may include a high concentration of p-type impurities.

The fifth active pattern ACT5 may correspond to a portion of the fifth transistor T5 that overlaps the fifth gate electrode GE5. In an embodiment, the fifth active pattern ACT5 may be formed of a semiconductor layer doped with a low concentration of p-type impurity.

A first end of the fifth source electrode SE5 may be coupled to the fifth active pattern ACT5. A second end of the fifth source electrode SE5 may be coupled to the power line PL through a fifth contact hole CH5.

A first end of the fifth drain electrode DE5 may be coupled to the fifth active pattern ACT5. A second end of the fifth drain electrode DE5 may be coupled with the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be coupled to the emission control line Ei. The sixth gate electrode GE6 may be provided as a part of the emission control line Ei, or formed to have a shape protruding from the emission control line Ei. For example, like the fifth gate electrode GE5, the sixth gate electrode GE6 may be formed by the emission control line Ei.

Each of the sixth active pattern ACT6, the sixth source electrode SE6, and the sixth drain electrode DE6 may be formed of an undoped semiconductor layer or a semiconductor layer doped with an impurity. For example, each of the sixth source electrode SE6 and the sixth drain electrode DE6 may be formed of a semiconductor layer doped with an impurity. The sixth active pattern ACT6 may be formed of an undoped semiconductor layer. Here, the impurity may include a high concentration of p-type impurities.

The sixth active pattern ACT6 may correspond to a portion of the sixth transistor T6 that overlaps the sixth gate electrode GE6. In an embodiment, the sixth active pattern ACT6 may be formed of a semiconductor layer doped with a low concentration of p-type impurity.

A first end of the sixth source electrode SE6 may be coupled to the sixth active pattern ACT6. A second end of the sixth source electrode SE6 may be coupled to the first drain electrode DE1 of the first transistor T1 and the third source electrode SE3 of the third transistor T3.

A first end of the sixth drain electrode DE6 may be coupled to the sixth active pattern ACT6. A second end of the sixth drain electrode DE6 may be coupled to the seventh source electrode SE7 of the seventh transistor T7. For example, the second end of the sixth drain electrode DE6 and the seventh source electrode SE7 may be directly connected to each other.

The seventh transistor T7 may include a seventh gate electrode GE7, seventh active pattern ACT7, a seventh source electrode SE7, and a seventh drain electrode DE7.

The seventh gate electrode GE7 may be coupled to the i+1-th scan line Si+1. The seventh gate electrode GE7 may be provided as a part of the i+1-th scan line Si+1 or formed to have a shape protruding from the i+1-th scan line Si+1. In other words, the seventh gate electrode GE7 may be formed by the i+1-th scan line Si+1.

Each of the seventh active pattern ACT7, the seventh source electrode SE7, and the seventh drain electrode DE7 may be formed of an undoped semiconductor layer or a semiconductor layer doped with an impurity. For example, each of the seventh source electrode SE7 and the seventh drain electrode DE7 may be formed of a semiconductor layer doped with an impurity. The seventh active pattern ACT7 may be formed of an undoped semiconductor layer. Here, the impurity may include a high concentration of p-type impurities.

The seventh active pattern ACT7 may correspond to a portion of the seventh transistor T7 that overlaps with the seventh gate electrode GE7. In an embodiment, the seventh active pattern ACT7 may be formed of a semiconductor layer doped with a low concentration of p-type impurity.

A first end of the seventh source electrode SE7 may be coupled to the seventh active pattern ACT7. A second end of the seventh source electrode SE7 may be coupled to the sixth drain electrode DE6 of the sixth transistor T6.

A first end of the seventh drain electrode DE7 may be coupled to the seventh active pattern ACT7. A second end of the seventh drain electrode DE7 may be coupled to the initialization power line IPL. Furthermore, the seventh drain electrode DE7 may be coupled to the fourth source electrode of the fourth transistor 14 of the pixel PXL disposed on the i+1-th row.

The seventh drain electrode DE7 may be coupled with the fourth source electrode SE4 of the fourth transistor T4 of the pixel disposed on the i+1-th row through the auxiliary connection line AUX and the eighth and ninth contact holes CH8 and CH9.

The storage capacitor Cst may include a lower electrode LE and an upper electrode UE. The lower electrode LE may be formed of the first gate electrode GE1 of the first transistor T1.

The upper electrode UE may overlap the lower electrode LE, and cover the lower electrode LE in a plan view. In other words, edges of the upper electrode UE may extend beyond and cover edges of the lower electrode LE in a plan view. The capacitance of the storage capacitor Cst may be increased by increasing an overlapping area between the upper electrode UE and the lower electrode LE. The upper electrode UE may extend in the first direction DR1.

In an embodiment of the present disclosure, a voltage having the same level as that of the first driving power source ELVDD may be applied to the upper electrode UE. The upper electrode UE may include an opening OPN in an area having the first contact hole CH1 through which the first gate electrode GE1 is coupled with the first connection line CNL1. The opening OPN may be split in two by the first contact hole CH1.

The light emitting element OLED may include first and second electrodes AE and CE, and an emission layer EML provided between the first and second electrodes AE and CE.

The first electrode AE may be provided in an emission area corresponding to the pixel PXL. The first electrode AE may be coupled to the seventh source electrode SE7 of the seventh transistor T7 and the sixth drain electrode DE6 of the sixth transistor T6 through a seventh contact hole CH7, a tenth contact hole CH10, and an eleventh contact hole CH11.

A second connection line CNL2 and a bridge pattern BRP may be provided between the seventh contact hole CH7 and the tenth contact hole CH10. The sixth drain electrode DE6, the seventh source electrode SE7, and the first electrode AE may be electrically coupled to each other through the second connection line CNL2 and the bridge pattern BRP.

As described above, among the first to seventh transistors T1 to T7 included in the pixel PXL, the first to third transistors T1 to T3 and the fifth to seventh transistors T5 to T7 may be formed of P-type transistors, and the fourth transistor T4 may be formed of a tunneling field effect transistor.

In an embodiment of the present disclosure, the fourth transistor T4 may further include a lightly doped region LDD provided between the fourth active pattern ACT4 and the fourth drain electrode DE4 For example, the fourth transistor T4 may include a lightly doped region LDD provided between the 4a-th active pattern ACT4a and the 4a-th drain electrode DE4a, and a lightly doped region LDD provided between the 4b-th active pattern ACT4b and the 4b-th drain electrode DE4b. In addition, the fourth transistor T4 may include a lightly doped region LDD provided between the 4b-th active pattern ACT4b and the 4b-th source electrode SE4b. The lightly doped region LDD may include a semiconductor layer doped with a low concentration of n-type impurities. In an embodiment of the present disclosure, the lightly doped region LDD may be formed in an area of about 0.2 μm to 2 μm. When the lightly doped region LDD is formed, the electric field in the vicinity of the 4b-th drain electrode DE4b may be reduced to prevent deterioration due to hot carrier injection.

Hereinafter, the configuration of the display device according to an embodiment of the present disclosure will be described in a stacking sequence with reference to FIGS. 6 to 9.

A buffer layer BFL may be provided on the substrate SUB. The buffer layer BFL may prevent impurities from being diffused into each of the first to seventh transistors T1 to T7. The buffer layer BFL may be provided in a single layer structure or a multilayer structure having at least two or more layers. In the case where the buffer layer BFL has a multi-layer structure, the respective layers may be formed of the same material or different materials. The buffer layer BFL may be omitted depending on the material of the substrate SUB or processing, conditions.

A semiconductor layer may be provided on the substrate SUB. Here, the semiconductor layer may include an active pattern (or channel area), a source electrode (or source area), and a drain electrode (or drain area) of the corresponding transistor.

A gate insulating layer GI may be provided on the substrate SUB on which the semiconductor layer is provided. The gate insulating layer GI may be an inorganic insulating layer containing an inorganic material.

The i−1-th scan line Si−1, the i-th scan line Si, the i+1-th scan line Si+1, the emission control line Ei, and the first to seventh gate electrodes GE1 to GE7 may be provided on the gate insulating layer GI. Each of the first to seventh gate electrodes GE1 to GE7 may be the gate electrode of the corresponding transistor.

In an embodiment of the present disclosure, the first gate electrode GE1 may be the lower electrode LE of the storage capacitor Cst. The second and third gate electrodes GE2 and GE3 may be formed integrally with the i-th scan line Si. The fourth gate electrode GE4 may be integrally formed with the i−1-th scan line Si−1. The seventh gate electrode GE7 may be integrally formed with the i+1-th scan line Si+1. The fifth and sixth gate electrodes GE5 and GE6 may be integrally formed with the emission control line Ei.

In an embodiment of the present disclosure, the fourth gate electrode GE4 is the gate electrode of the fourth transistor T4 formed of the tunneling field effect transistor, and includes 4a-th and 4b-th gate electrodes GE4a and GE4b. The 4a-th gate electrode GE4a is provided on the 4a-th active pattern. ACT4a with the gate insulating layer GI being interposed therebetween, and the 4b-th gate electrode GE4b is provided on the 4b-th active pattern ACT4b with the gate insulating layer GI being interposed therebetween.

In an embodiment of the present disclosure, as shown in FIG. 8, the 4a-th gate electrode GE4a may include a lower surface GE4a_1 that is in contact with the gate insulating layer GI, an upper surface GE4a_2 above the lower surface GE4a_1 and facing the lower surface GE4a_1, and first and second side surfaces GE4a_3 and GE4a_4 that connect the lower surface GE4a_1 and the upper surface GE4a_2.

The first side surface GE4a_3 of the 4a-th gate electrode GE4a may extend from a first side of the lower surface GE4a_1 corresponding to a first boundary point B1 between the 4a-th active pattern ACT4a and the lightly doped region LDD to a first side of the upper surface GE4a_2. The first side surface GE4a_3 of the 4a-th gate electrode GE4a may be inclined while having a first inclination θ1. In other words, the first side surface GE4a_3 of the 4a-th gate electrode GE4a is inclined with a first angle.

The second side surface GE4a_4 of the 4a-th gate electrode GE4a may extend from a second side of the lower surface GE4a_1 corresponding to a second boundary point B2 between the 4a-th active pattern ACT4a and the 4a-th source area SE4a to a second side of the upper surface GE4a_2. The second side surface GE4a_4 of the 4a-th gate electrode GE4a may be inclined while having a second inclination θ2. In other words, the second side surface GE4a_4 of the 4a-th gate electrode GE4a is inclined with a second angle. The first inclination θ1 of the first side surface GE4a_3 of the 4a-th gate electrode GE4a may be different from the second inclination θ2 of the second side surface GE4a_4 of the 4a-th gate electrode GE4a. For example, the second inclination θ2 may be larger than the first inclination θ1. In other words, the second side surface GE4a_4 of the 4a-th gate electrode GE4a may have a steeper slope than the first side surface GE4a3 of the 4a-th gate electrode GE4a. Consequently, the first and second side surfaces GE4a_3 and GE4a_4 of the 4a-th gate electrode GE4a have different tapered shapes.

In an embodiment of the present disclosure, the first inclination θ1 may be about 30° to about 70° and the second inclination θ2 may be about 50° to about 120°. However, the present disclosure is not limited thereto.

Figure 10C:
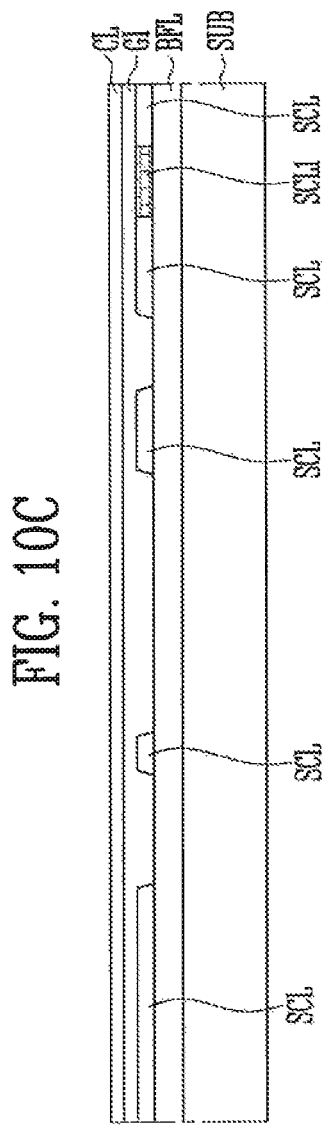
Figure 10D:
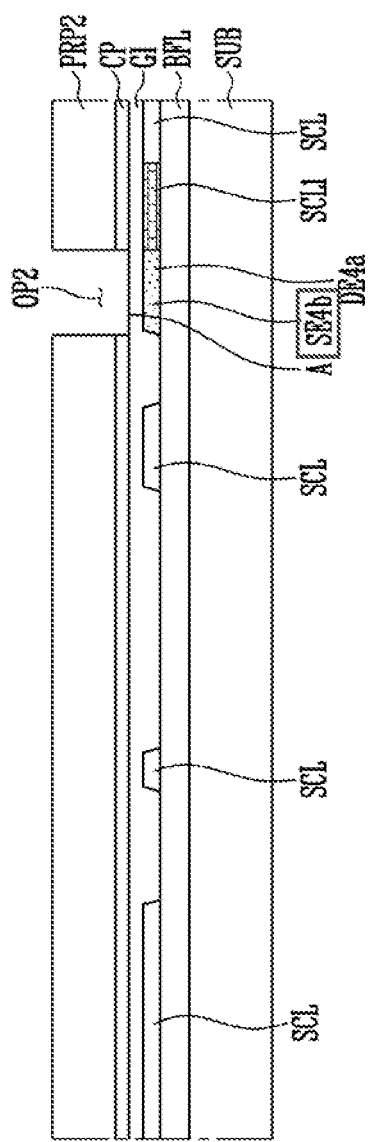
Figure 10H:
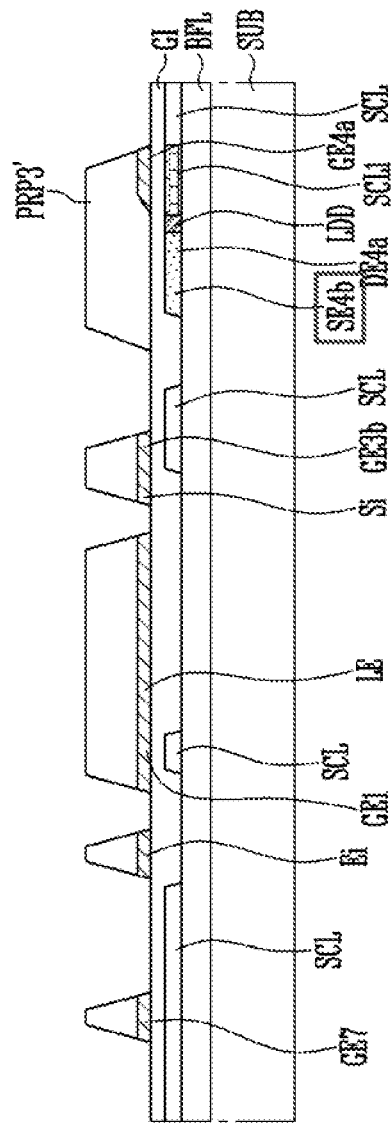
Figure 10I:
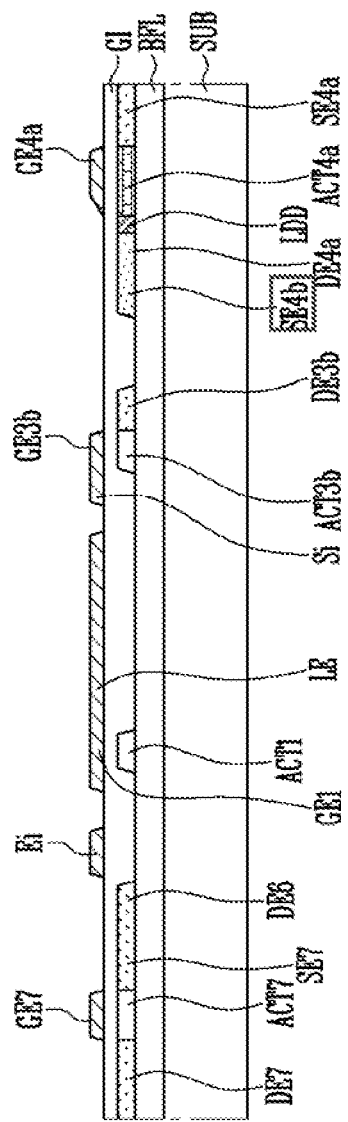
Figure 10K:
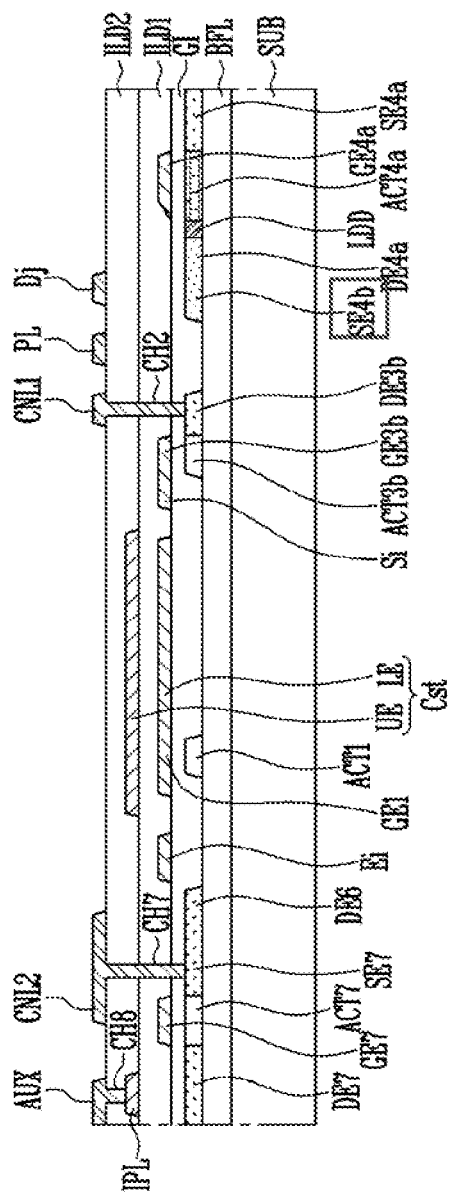
Figure 10L:
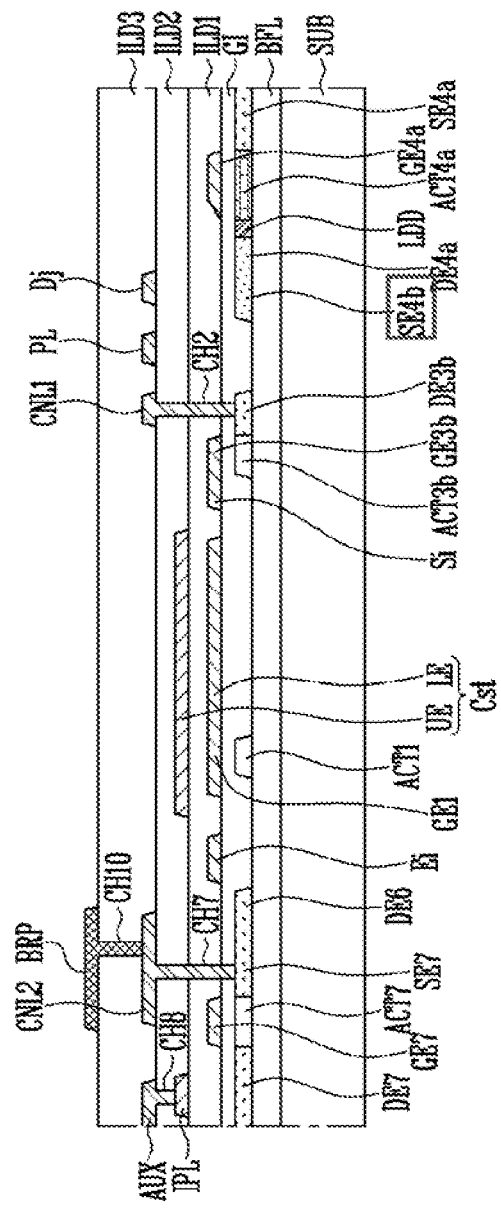
Figure 10M:
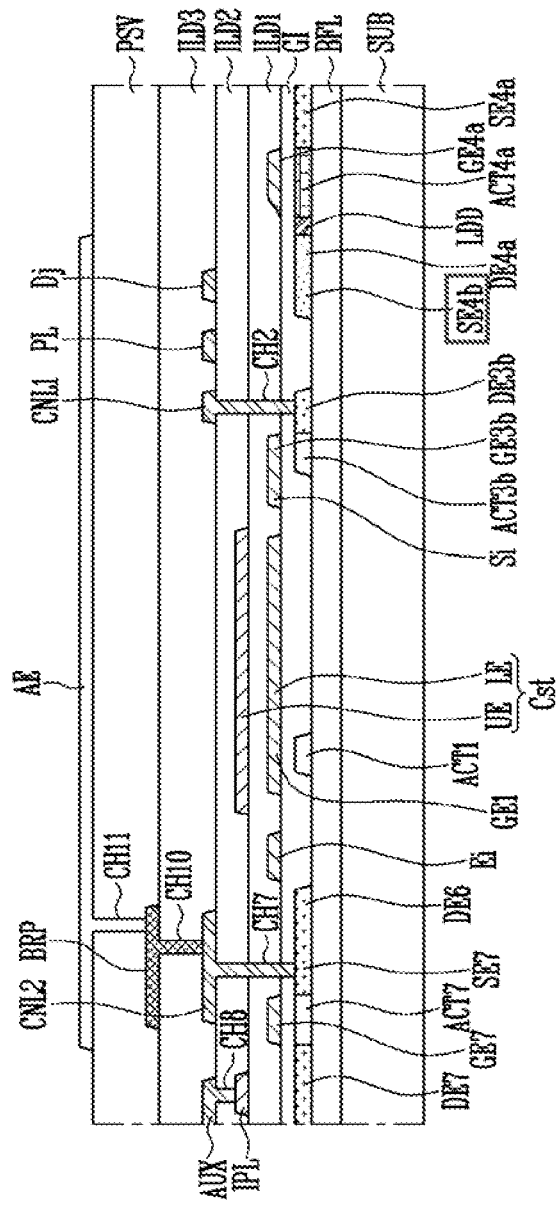
Figure 10N:
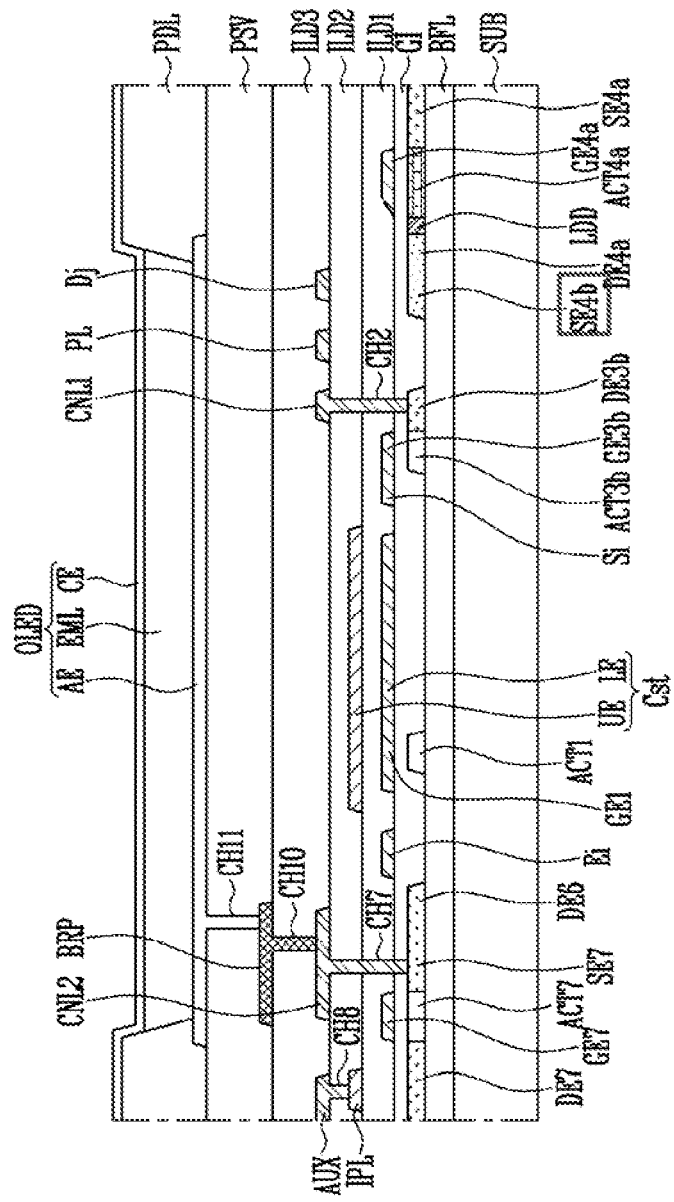

The first and second side surfaces GE4a_3 and GE4a_4 of the 4a-th gate electrode GE4a have different tapered shapes because a portion of the first side surface GE4a_3 of the 4a-th gate electrode GE4a is etched in a process of forming the lightly doped region LDD. A detailed description thereof will be described below with reference to FIG. 10E.

Furthermore, in the process of forming the tightly doped region LDD, a portion of the gate insulating layer GI corresponding to each of the 4a-th and 4b-th drain electrodes DE4a and DE4b may be etched. Thus, a thickness di of an area of the gate insulating layer GI corresponding to the 4a-th and 4b-th drain electrodes DE4a and DE4b may be thinner than a thickness d2 of an area of the gate insulating layer GE corresponding to components other than the 4a-th and 4b-th drain electrodes DE4a and DE4b. For example, as shown in FIG. 8, the thickness d2 of an area of the gate insulating layer corresponding to the 4a-th source electrode SE4a may be thicker than the thickness d1 of the area of the gate insulating layer GI corresponding to the 4a-th and 4b-th drain electrodes DE4a and DE4b.

A first interlayer insulating layer ILD1 may be provided on the substrate SUB on which the scan lines Si−1, Si, and Si+1 and the first to seventh gate electrodes GE1 to GE7, etc. are provided. A thickness of the first interlayer insulating layer ILD1 may be greater in an area overlapping the 4a-th and 4b-th drain electrodes DE4a and DE4b than in an area overlapping the 4a-th source electrode SE4a.

The upper electrode UE of the storage capacitor Cst and the initialization power line IPL may be provided on the first interlayer insulating layer ILD1.

The upper electrode UE may cover the lower electrode LE. The upper electrode UE may form the storage capacitor Cst along with the lower electrode LE, with the first interlayer insulating layer ILD1 interposed between the upper and lower electrodes UE and LE.

A second interlayer insulating layer ILD2 may be provided on the substrate SUB on which the tipper electrode UE and the initialization power line IPL have been disposed.

First and second connection lines CNL1 and CNL2, an auxiliary connection line AUX, a data line Dj, and a power line PL may be provided on the second interlayer insulating layer ILD2.

The first connection line CNL1 may be coupled to the first gate electrode GE1 through the first contact hole CH1 that successively passes through the first and second interlayer insulating layers ILD1 and ILD2. Furthermore, the first connection line CNL1 may be coupled to the 3b-th drain electrode DE3b and the 4b-th drain electrode DE4b through the second contact hole CH2 that passes through the gate insulating layer GI and the first and second interlayer insulating layers ILD1 and ILD2.

The second connection line CNL2 may be a pattern provided to connect the sixth drain electrode DE6, the seventh source electrode SE7, and the first electrode AE with each other. The second connection line CNL2 may be provided between the sixth drain electrode DE6, the seventh source electrode SE7, and the first electrode AE. The second connection line CNL2 may be coupled to the sixth drain electrode DE6 and the seventh source electrode SE7 through the seventh contact hole CH7 that passes through the gate insulating layer GI and the first and second interlayer insulating layers ILD1 and ILD2.

The auxiliary coupling line AUX may be coupled to the initialization power line IPL through the eighth contact hole CH8 that passes through the second interlayer insulating layer ILD2. Furthermore, the auxiliary connection line AUX may be coupled to the 4a-th source electrode SE4a and the seventh drain electrode DE7 of the pixel PXL disposed on the i−1-th row through the ninth contact hole CH9 that passes through the gate insulating layer GI and the first and second interlayer insulating layers ILD1 and ILD2.

The data line Dj may be coupled to the second source electrode SE2 through the sixth contact hole CH6 that passes through the gate insulating layer GI and the first and second interlayer insulating layers ILD1 and ILD2.

The power line PL may be coupled to the upper electrode UE through the third and fourth contact holes CH3 and CH4 that pass through the second interlayer insulating layer ILD2. Furthermore, the power line PL may be coupled to the fifth source electrode SE5 through the fifth contact hole CH5 that passes through the gate insulating layer GI and the first and second interlayer insulating layers ILD1 and ILD2.

The third interlayer insulating layer ILD3 may be provided on the first and second connection lines CNL1 and CNL2, the auxiliary connection line AUX, the data line Dj, and the power line PL. In other words, the first and second connection lines CNL1 and CNL2, the auxiliary connection line AUX, the data line Dj, and the power line PL may be covered by the third interlayer insulating layer ILD3. The third interlayer insulating layer ILD3 may include an inorganic insulating layer made of inorganic material or an organic insulating layer made of organic material.

A bridge pattern BRP may be provided on the third interlayer insulating layer ILD3. The bridge pattern BRP may be coupled to the second connection line CNL2 through the tenth contact hole CH10 that passes through the third interlayer insulating layer ILD3.

A passivation layer PSV may be provided on the bridge pattern BRP.

The first electrode AE may be provided on the passivation layer PSV. The first electrode AE may be coupled to the bridge pattern BRP through the eleventh contact hole CH11 passing through the passivation layer PSV. Since the bridge pattern BRP is coupled to the second connection line CNL2 through the tenth contact hole CH10, the first electrode AE may be eventually coupled to the sixth drain electrode DE6 and the seventh source electrode SE7 through the bridge pattern BRP and the second connection line CNL2 In other words, the first electrode AE may be electrically connected to the sixth transistor T6 and the seventh transistor T7.

A pixel defining layer PDL for defining an emission area corresponding to each pixel PXL may be provided on the substrate SUB on which the first electrode AE have been formed. The pixel defining layer PDL may expose an upper surface of the first electrode AE and protrude from the substrate SUB along the perimeterof the pixel PXL. The pixel defining layer PDL may include an organic insulating material.

The emission layer EML may be provided on the exposed upper surface of the first electrode AE. The second electrode CE may be provided on the emission layer EML.

The emission layer EML may lie disposed on the exposed surface of the first electrode AE. The emission layer EML may have a multilayer thin-film structure including at least a light generation layer. The emission layer EML may include: a hole injection layer into which holes are injected; a hole transport layer which has excellent hole transportation performance and restrains movement of electrons that have not been coupled with holes in the light generation layer and thus increases chances of recombination between holes and electrons; the light generation layer which emits light by recombination between injected electrons and holes; a hole blocking layer which restrains movement of holes that have not been coupled with electrons in the light generation layer; an electron transport layer which is provided to smoothly transport electrons to the light generation layer; and an electron injection layer into which electrons are injected.

The color of light generated from the light generation layer may be one of red, green, blue and white, but in the present embodiment, it is not limited thereto. For example, the color of light generated from the light generation layer of the emission layer EML may be one of magenta, cyan, and yellow. The hole injection layer, the hole transport layer, the hole blocking layer, the electron transport layer, and the electron injection layer of the emission layer EML may be common layers coupled between adjacent emission areas.

A thin film encapsulation layer TFE may be provided on the second electrode CE to cover the second electrode CE.

The thin film encapsulation layer TFE may be formed of a single layer, or multi-layers. The thin film encapsulation layer TFE may include a plurality of insulating layers configured to cover the light emitting element OLED. For example, the thin film encapsulation layer TFE may include a plurality of inorganic layers and a plurality of organic layers. For example, the thin film encapsulation layer TFE may have a structure formed by alternately stacking the inorganic layers and the organic layers. In some embodiments, the thin film encapsulation layer TFE may be an encapsulation substrate which is disposed on the light emitting element OLED and joined to the substrate SUB by a sealant.

The display device in accordance with an embodiment of the present disclosure may further include a touch sensor provided on the thin film encapsulation layer TFE. The touch sensor may be disposed on a surface of the pixels PXL in a direction in which the image is emitted, and may receive a user's touch input. The touch sensor may recognize a touch event to the display device through a user's hand or a separate input means.

An embodiment of the present disclosure provides a pixel PXL including: a light emitting element OLED; a first transistor T1 connected between a first node N1 and the light emitting element OLED to control current flowing from a first driving power source ELVDD through the light emitting element OLED to a second driving power source ELVSS; a second transistor T2 connected between a data line Dj and the first transistor T1, and turned on in response to a first scan signal; a third transistor T3 connected between the first transistor T1 and the first node N!, and turned on in response to the first scan signal; and a fourth transistor T4 connected between an initialization power line Vint and the first node N1, and turned on in response to a second scan signal, wherein the fourth transistor T4 is a tunneling field effect transistor comprising a source area SE4a and a drain area DE4a that are spaced apart from each other and have opposite conductivities, a channel area ACT4a provided between the source area SE4a and the drain area DE4a, and a gate electrode GE4a provided on the channel area ACT4a with a gate insulating layer GI interposed therebetween.

Figure 10O:
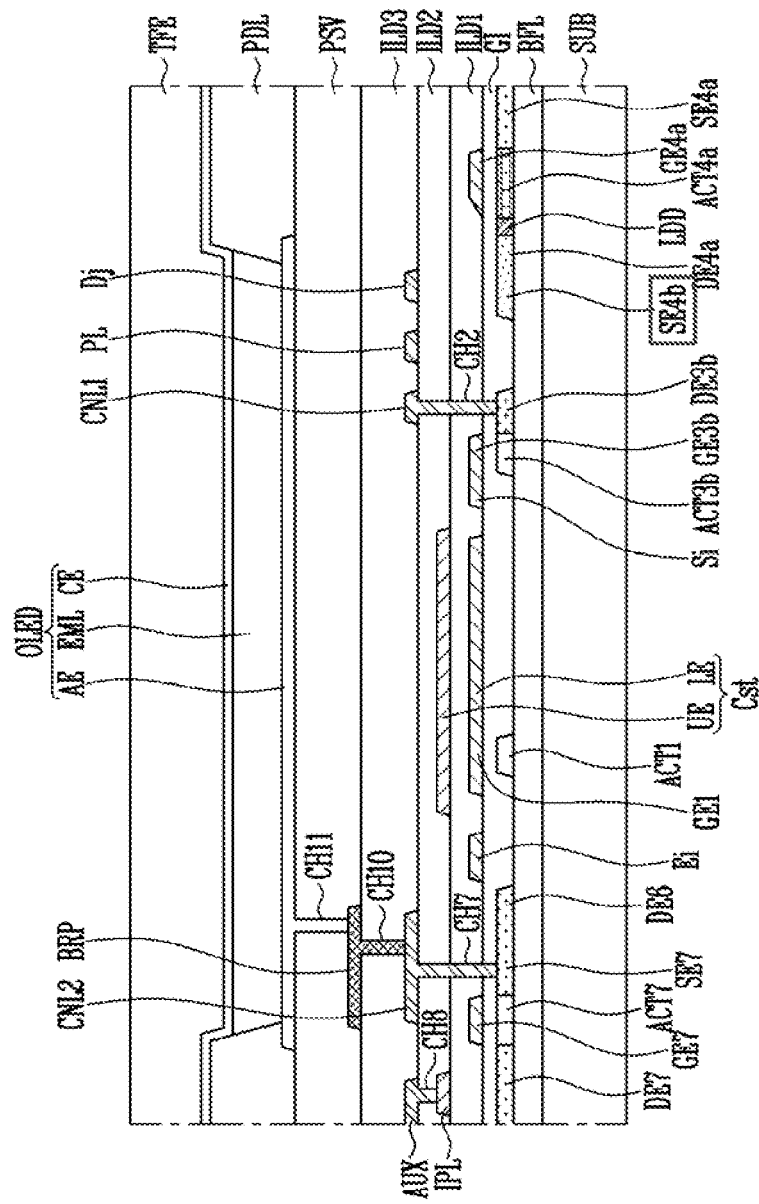

FIGS. 10A to 10O are sectional views sequentially illustrating a method of manufacturing the display device shown in FIG. 7.

Referring to FIGS. 1 to 10A, a substrate SUB may be provided.

The substrate SUB may be made of a transparent organic material or a transparent plastic material containing $SiO_2$ as a main component. A buffer layer BFL, may be provided on the substrate SUB. In an embodiment, the buffer layer BFL may be omitted.

After depositing a semiconductor material layer on the buffer layer BFL, a mask process is performed to form a semiconductor layer SCL in each of the display area DA and the non-display area NDA of the substrate SUB.

The semiconductor material layer may be formed of silicon (Si), i.e., amorphous silicon (a-Si), or may be formed of polysilicon (p-Si). In the case where the semiconductor material layer is formed of amorphous silicon (a-Si), a crystallization process using a laser may be further performed.

In an embodiment, the semiconductor material layer may be formed of semiconductor oxide including a two-component compound (ABx), a three-component compound (ABxCy), a four-component compound (ABxCyDz), etc., containing indium, zinc, tin, gallium, titanium, aluminum, hafnium, zirconium, magnesium, and so forth. These components may be used alone or in combination with each other.

The semiconductor layer SCL is doped with p-type impurities including boron (B) to form a semiconductor layer corresponding to the channel area of the P-type transistor included in the pixel PXL disposed in the display area DA. At this time, boron (B) ions are injected into the semiconductor layer SCL with a dose of about $0.1E12/cm^2$ to $7E12/cm^2$.

A semiconductor layer corresponding to the channel area of at least one of the first, third, fifth or seventh P-type transistors T1, T3, T5, or T7 included in the first to fourth CMOS circuit components CM1 to CM4 of the scan driver SDV disposed in the non-display area NDA may be formed. Here, the channel area of at least one of the second, fourth, sixth or eighth N-type transistors T2, T4, T6, or T8 included in the first to fourth CMOS circuit components CM1 to CM4 may be covered with a photosensitive pattern.

Referring to FIGS. 1 to 10B, after depositing a photosensitive material on the substrate SUB including the semiconductor layer SCL, the mask process is performed to form a first photosensitive pattern PRP1. The first photosensitive pattern PRP1 includes a first opening OP1 that exposes a portion of the semiconductor layer SCL to the outside.

The semiconductor layer SCL exposed by the first opening OP1 is doped with impurities including boron (B) to form the semiconductor layer SCL1 (hereinafter referred to as a 'first semiconductor layer') corresponding to the channel area of the tunneling field effect transistor included in the pixel PXL disposed in the display area DA. At this time, boron (B) ions are injected into the semiconductor layer SCL exposed by the first opening OP1, with a dose of about $0.1E12/cm^2$ to $7E12/cm^2$.

A semiconductor layer corresponding to the channel area of the second, fourth, sixth and eighth N-type transistors T2, T4, T6, and T8 included in the first to fourth CMOS circuit components CM1 to CM4 of the scan driver SDV disposed in the non-display area NDA may be formed. The channel area of the first, third, fifth and seventh P-type transistors T1, T3, T5, and T7 included in the first to fourth CMOS circuit components CM1 to CM4 may be covered by the first photosensitive pattern PRP1.

Subsequently, the first photosensitive pattern PRP1 is removed.

Referring to FIGS. 1 to 10C, the gate insulating layer GI is deposited on the entire surface of the substrate SUB, and a conductive layer CL is formed on the gate insulating layer GI. The conductive layer CL may be formed in both the display area DA and the non-display area NDA of the substrate SUB.

Referring to FIGS. 1 to 10D, after depositing a photosensitive material layer on the conductive layer CL, a mask process is performed to form a second photosensitive pattern PRP2 including a second opening OP2 that exposes a portion of the conductive layer CL to the outside.

Subsequently, a portion of the conductive layer CL corresponding to the second opening OP2 is removed using the second photosensitive pattern PRP2 as an etching mask, thus forming the conductive pattern CP and simultaneously exposing an area A of the gate insulating layer GI to the outside.

Consecutively, the semiconductor layer SCL corresponding to the area A of the gate insulating layer GI that is exposed to the outside is doped with a high concentration of n-type impurities to form 4a-th and 4b-th drain electrodes DE4a and DE4b having conductivity. In other words, the semiconductor layer SCL adjacent to the first semiconductor layer SCL1 and overlapped by the second opening OP2 is doped to loan the 4a-th and 4b-th drain electrodes DE4a and DE4b. The 4a-th and 4b-th drain electrodes DE4a and DE4b correspond to the drain area of the tunneling field effect transistor included in the pixel PXL disposed in the display area DA. The n-type impurities may include phosphorus (P) arsenic (As), antimony Sb), etc. having five peripheral electrons. In an embodiment of the present disclosure, the n-type impurities may include phosphorus (P). At this time, phosphorus (P) ions are injected into the corresponding semiconductor layer SCl, with a dose of about $1.0E12/cm^2$ to $1E16/cm^2$. Although not shown in the drawings, a 4b-th source electrode SE4b doped with a high concentration of n-type impurities may be formed.

Source and drain electrodes having the conductivity of the second, fourth, sixth and eighth N-type transistors T2, T4, T6, and T8 included in the first to fourth CMOS circuit components CM1 to CM4 of the scan driver SDV disposed in the non-display area NDA may be figured.

Referring to FIGS. 1 to 10E and 10F, ashing process is performed to etch the second photosensitive pattern PRP2 and the conductive pattern CP disposed thereunder.

Due to the ashing process, a second photosensitive etch pattern PRP2' in which a portion of the second photosensitive pattern PRP2 is etched may be formed, and simultaneously a conductive etch pattern CP' in which a portion of the conductive pattern CP is etched may be formed. As the second photosensitive pattern PRP2 and the conductive pattern CP are etched, the second opening OP2 may be increased in width and/or size.

A portion of the gate insulating layer GI may be farther exposed to the outside by the second opening OP2 which is increased in width and/or size. A portion of the gate insulating layer GI exposed to the outside may include an area corresponding to a portion of the first semiconductor layer SCL1.

When the ashing process is performed, the area A of the gate insulating layer GI exposed to the outside by the second opening OP2 may be etched, so that the thickness of the area A of the gate insulating layer GI may be reduced as illustrated in FIG. 8. Thus, the thickness of the area A of the gate insulating layer GI corresponding to the 4a-th and 4b-th drain electrodes DE4a and DE4b may be different from the thickness of areas other than the area A of the gate insulating layer GI. For example, the thickness of the area A of the gate insulating layer GI corresponding to the 4a-th and 4b-th drain electrodes DE4a and DE4b may be less than the thickness of the areas other than the area A of the gate insulating layer GI. In an embodiment of the present disclosure, when the ashing process is performed, the area A of the gate insulating layer GI may be etched by several Å from the thickness of the gate insulating layer GI. However, the present disclosure is not limited thereto. According to an embodiment, the etching degree for the area A of the gate insulating layer GI may vary depending on the duration of the ashing process and the thickness of the gate insulating layer GI.

Furthermore, when the ashing process is performed, a portion of the second photosensitive pattern PRP2 is etched and a side of the conductive pattern CP that is not covered by the second photosensitive pattern PRP2 is etched. Thus, the side of the conductive etch pattern CP' may be inclined.

After the ashing process is performed, the first semiconductor layer SCL1 corresponding to a portion of the gate insulating layer GI exposed to the outside using the second photosensitive etch pattern PRP2' and the conductive etch pattern CP' as the mask is doped with n-type impurities including a low concentration of phosphorus (P), arsenic (As), antimony (Sb), etc., thus forming the lightly doped region LDD of the tunneling field effect transistor included in the pixel PXL disposed in the display area DA, as illustrated in FIG. 10F.

The lightly doped regions of the second, fourth, sixth and eighth N-type transistors T2, T4, T6, and T8 included in the first to fourth CMOS circuit components CM1 to CM4 of the scan driver SDV disposed in the non-display area. NDA are formed.

Subsequently, the second photosensitive etch pattern PRP2' is removed from the substrate SUB.

Referring to FIGS. 1 to 10G, after depositing a photosensitive material layer on the conductive etch pattern CP', a mask process is performed to form a third photosensitive pattern PRP3 including a third opening OP3 that exposes a portion of the conductive etch pattern CP' to the outside.

The third photosensitive pattern PRP3 may cover the 4b-th source electrode E4b, the 4a-th and 4b-th drain electrodes DE4a and DE4b, the lightly doped region LDD, and the first semiconductor layer SCL1 of the tunneling field effect transistor of the pixel PXL disposed in the display area DA.

The third photosensitive pattern PRP3 may cover the channel areas, the source electrodes, the drain electrodes, and the lightly doped regions of the second, fourth, sixth and eighth N-type transistors T2, T4, T6, and T8 included in the first to fourth CMOS circuit components CM1 to CM4 of the scan driver SDV disposed in the non-display area NDA.

Referring to FIGS. 1 to 10H, the conductive etch pattern CP' corresponding to the third opening OP3 is removed using the third photosensitive pattern PRP3 the etch mask, thus forming gate patterns and simultaneously exposing a portion of the gate insulating layer GI to the outside. By the above-described process, a portion of the third photosensitive pattern PRP3 may be removed to form the third photosensitive etch pattern PRP3'.

In an embodiment of the present disclosure, the gate pattern may include first to seventh gate electrodes GE1 to GE7 included in the pixel PXL disposed in the display area DA, the lower electrode LE of the storage capacitor Cst, the scan lines Si−1, Si, and Si+1, and the emission control line Ei. Furthermore, the gate pattern may include the gate electrode of each of the first, third, fifth and seventh P-type transistors T1, T3, T5 and T7 and the second, fourth, sixth and eighth N-type transistors T2, T4, T6 and T8 included in the first to fourth. CMOS circuit components CM1 to CM4 of the scan driver SDV disposed in the non-display area NDA.

When the etching process is performed, the side surface of the conductive etch pattern. CP' may be etched to have a shape corresponding to the third photosensitive etch pattern PRP3'. Thus, both side surfaces of the gate pattern may be inclined, in other words, the gate pattern may have a tapered shape. In particular, both side surfaces of the 4a-th gate electrode GE4a included in the pixel PXL disposed in the display area DA may be inclined while having different inclinations. For example, a first side surface of the 4a-th gate electrode GE4a may be inclined at a first angle and a second side surface of the 4a-th gate electrode GE4a may be inclined at a second angle different from the first angle. In other words, both side surfaces of the 4a-th gate electrode GE4a may have different tapered shapes.

The second, fourth, sixth, and eighth transistors T2, T4, T6 and T8 that are N-type transistors may be formed on the scan drier SDV disposed in the non-display area NDA through the above-described manufacturing process.

Referring to FIGS. 1 to 10I, the semiconductor layer SCL, corresponding to the gate insulating layer GI exposed to the outside using the third photosensitive etch pattern PRP3' as the mask is doped with a high concentration of p-type impurities. The p-type impurities may include aluminum (Al), gallium (Ga), indium (in), boron (B) etc. having three peripheral electrons. In an embodiment of the present disclosure, the p-type impurities may include boron (B). At this time, boron (B) ions are injected into the corresponding semiconductor layer SCL with a dose of about $1.0E12/cm^2$ to $1E16/cm^1$.

As the semiconductor layer SCL is doped with a high concentration of p-type impurities, first, second, 3a-th, 3b-th, 4a-th, fifth, sixth, and seventh source electrodes SE1, SE2, SE3a, SE3b, SE4a, SE5, SE6 and SE7 having conductivity may be formed. Simultaneously, first, second, 3a-th, 3b-th, fifth, sixth, and seventh drain electrodes DE1, DE2, DE3a, DE3b, DE5, DE6, and DE7 may be formed.

Due to the first gate electrode the semiconductor layer SCE, that is not doped with a high-concentration of p-type impurities may become the first active pattern ACT1. The first active pattern ACT1 may be the semiconductor layer corresponding to the channel area of the first transistor T1. The first gate electrode GE1, the first active pattern ACT1, the first source electrode SE1, and the first drain electrode DE1 may form the first transistor T1 that is the P-type transistor. The first gate electrode GE1 may also form the lower electrode LE of the storage capacitor Cst.

Due to the second gate electrode GE2, the semiconductor layer SCL that is not doped with a high-concentration of p-type impurities may become the second active pattern ACT2. The second active pattern ACT2 may be the semiconductor layer corresponding to the channel area of the second transistor T2. The second gate electrode GE2, the second active pattern ACT2, the second source electrode SE2, and the second drain electrode DE2 may form the second transistor T2 that is the P-type transistor.

Due to the 3a-th gate electrode GE3a, the semiconductor layer SCL that is not doped with a high-concentration of p-type impurities may become the 3a-th active pattern ACT3a. The 3a-th active pattern ACT3a may be the semiconductor layer corresponding to the channel area of the 3a-th transistor T3a. The 3a-th gate electrode GE3a, the 3a-th active pattern ACT3a, the 3a-th source electrode SE3a, and the 3a-th drain electrode DE3a may form the 3a-th transistor T3a that is the P-type transistor.

Due to the 3b-th gate electrode GE3b, the semiconductor layer SCL that is not doped with a high-concentration of p-type impurities may become the 3b-th active pattern ACT3b. The 3b-th active pattern ACT3b may be the semiconductor layer corresponding to the channel area of the 3b-th transistor T3b. The 3b-th gate electrode GE3b, the 3b-th active pattern ACT3b, the 3b-th source electrode SE3b, and the 3b-th drain electrode DE3b may form the 3b-th transistor T3b that is the P-type transistor.

Due to the 4a-th gate electrode GE4a, the first semiconductor layer SCL1 that is not doped with a high-concentration of p-type impurities may become the 4a-th active pattern ACT4a. The 4a-th active pattern ACT4a may be the semiconductor layer corresponding to the channel area of the 4a-th transistor T4a. In other words, the 4a-th active pattern ACT4a may be provided between the 4a-th source electrode SE4a and the 4a-th drain electrode DE4a. As described above, the 4a-th source electrode SE4a is doped with a high concentration of p-type impurities, and the 4a-th drain electrode DE4a is doped with a high concentration of n-type impurities. Thus, the 4a-th gate electrode GE4a, the 4a-th active pattern ACT4a, the 4a-th source electrode SE4a, and the 4a-th drain electrode DE4a may form the 4a-th transistor T4a that is the tunneling field effect transistor. In an embodiment of the present disclosure, the 4a-th transistor T4a, may include a lightly doped region LDD provided between the 4a-th active pattern ACT4a and the 4a-th drain electrode DE4a. In an embodiment of the present disclosure, the gate insulating layer GI may be disposed between the 4a-th active pattern ACT4a of the 4a-th transistor T4a. In an embodiment of the present disclosure, a distance between the 4a-th source electrode SE4a and the 4a-th drain electrode DE4a may be predetermined.

Due to the 4b-th gate electrode GE4b, the first semiconductor layer SCL1 that is not, doped with a high-concentration of p-type impurities may become the 4b-th active pattern ACT4b. The 4b-th active pattern ACT4b may be the semiconductor layer corresponding to the channel area of the 4b-th transistor T4b. As described above, the 4b-th source electrode SE4b is doped with a high concentration of n-type impurities, and the 4b-th drain electrode DE4b is doped with a high concentration of n-type impurities. In an embodiment of the present disclosure, the 4b-th transistor T4b may include a lightly doped region LDD provided between the 4b-th active pattern ACT4b and the 4b-th drain electrode DE4b.

Due to the fifth gate electrode GE5, the semiconductor layer SCL that is not doped with a high-concentration of p-type impurities may become the fifth active pattern ACT5. The fifth active pattern ACT5 may be the semiconductor layer corresponding to the channel area of the fifth transistor T5. The fifth gate electrode GE5, the fifth active pattern ACT5, the fifth source electrode SE5, and the fifth drain electrode DE5 may form the fifth transistor T5 that is the P-type transistor.

Due to the sixth gate electrode GE6, the semiconductor layer SCL, that is not doped with a high-concentration of p-type impurities may become the sixth active pattern ACT6. The sixth active pattern ACT6 may be the semiconductor layer corresponding to the channel area of the sixth transistor T6. The sixth gate electrode GE6, the sixth active pattern ACT6, the sixth source electrode SE6, and the sixth drain electrode DE6 may form the sixth transistor T6 that is the P-type transistor.

Due to the seventh gate electrode GE7, the semiconductor layer SCL that is not doped with a high-concentration of p-type impurities may become the seventh active pattern ACT7. The seventh active pattern ACT7 may be the semiconductor layer corresponding to the channel area of the seventh transistor T7. The seventh gate electrode GE7, the seventh active pattern ACT7, the seventh source electrode SE7, and the seventh drain electrode DE7 may form the seventh transistor T7 that is the P-type transistor. The seventh source electrode SE7 and the sixth drain electrode DE6 may be directly connected to each other.

In addition, source and drain electrodes having the conductivity of the P-type transistor included in the first to fourth CMOS circuit components CM1 to CM4 of the scan driver SDV disposed in the non-display area NDA may be formed. Thus, the first, third, fifth, and seventh transistors T1, T3, T5 and T7 that are the P-type transistor included in the first to fourth CMOS circuit components CM1 to CM4 may be finally formed.

Subsequently, the third photosensitive etch pattern PRP3' is removed from the substrate SUB.

Through the above-described manufacturing process, the first to third transistors T1 to T3 and the fifth to seventh transistors T5 to T7 that are the P-type transistor, and the fourth transistor T4 that is the tunneling field effect transistor may be finally formed in the pixel PXL disposed in the display area DA.

Furthermore, the first, thud, fifth, and seventh transistors T1, T3, T5 and T7 that are the P-type transistor may be formed on the first to fourth CMOS circuit components CM1 to CM4 of the scan driver SDV disposed in the non-display area NDA through the above-described manufacturing process.

Consequently, the first to seventh transistors T1 to T7 included in the pixel PXL disposed in the display area DA may be formed by the same process as the first to eighth transistors T1 to T8 included in the first to fourth CMOS circuit components CM1 to CM4 of the scan driver SDV disposed in the non-display area NDA. Particularly, the fourth transistor T4 formed as the tunneling field effect transistor included in the pixel PXL disposed in the display area DA may be formed by the same process as that used to manufacture the second, fourth, sixth and eighth N-type transistors T2, 14, T6 and 18 and the first, third, fifth and seventh P-type transistors T1, T3, T5 and T7 included in the first to fourth CMOS circuit components CM1 to CM4 of the scan driver SDV disposed in the non-display area NDA.

Thus, the fourth transistor T4 formed as the tunneling filed effect transistor may be formed in the pixel PXL without an additional process.

Referring to FIGS. 1 to 10J, the first interlayer insulating layer ILD1 is formed on the substrate SUB to cover the gate electrodes of the first to seventh transistors T1 to T7. The first interlayer insulating layer ILD1 may be an inorganic insulating layer including inorganic material.

After a conductive material layer (not shown) is deposited on the first interlayer insulating layer ILD1, a mask process is performed to form the initialization power line IPL, and the upper electrode UE of the storage capacitor Cst on an upper surface of the first interlayer insulating layer ILD1.

Referring to FIGS. 1 to 10K, after depositing the insulating material layer on the substrate SUB on which the upper electrode UE is formed, a mask process is performed to form the second interlayer insulating layer ILD2. The second interlayer insulating layer ILD2 may include the eighth contact hole CH8 through which a portion of the initialization power line IPL is exposed.

By the above-described mask process, a portion of the second interlayer insulating layer ILD2 and portions of the first interlayer insulating layer ILD1 and the gate insulating layer GI disposed thereunder may be removed to form the seventh contact hole CH7 that exposes the seventh source electrode SE7 and the second contact hole CH2 that exposes the drain electrode DE3b.

Subsequently, after the conductive material layer is deposited on the second interlayer insulating layer ILD2, a mask process is performed to form the first and second connection lines CNL1 and CNL2, the power line PL, the auxiliary connection line AUX, and the data line Dj.

The first connection line CNL1 may be coupled to the 3b-th drain electrode DE3b through the second contact hole CH2. The second connection line CNL2 may be coupled to the seventh source electrode SE7 through the seventh contact hole CH7. The auxiliary connection line AUX may be coupled to the initialization power line IPL through the eighth contact hole CH8.

Referring to FIGS. 1 to 10L, after depositing the insulating material layer on the substrate SUB on which the first and second connection lines CNL1 and CNL2 are formed, a mask process is performed to form the third interlayer insulating layer ILD3. The third interlayer insulating layer ILD3 may include the tenth contact hole CH10 through which a portion of the second connection line CNL2 is exposed.

Subsequently, after depositing the conductive material layer on the third interlayer insulating layer ILD3, a mask process is performed to form the bridge pattern BRP. The bridge pattern BRP may be coupled to the second connection line CNL2 through the tenth contact hole CH10.

Referring to FIGS. 1 to 10M, after depositing the insulating material layer on the substrate SUB on which the bridge pattern BRP is formed, the mask process is performed to form the passivation layer PSV The passivation layer PSV may include the eleventh contact hole CH11 through which a portion of the bridge pattern BRP is exposed. The bridge pattern BRP may be used to connect the seventh source electrode SE7 of the seventh transistor T7 and an upper layer component.

Subsequently, after depositing the conductive material layer (not shown) on the passivation layer PSV, a mask process is performed to form the first electrode AE. The first electrode AE may be coupled to the bridge pattern BRP through the eleventh contact hole CH11.

Referring to FIGS. 1 to 10N, after forming the first electrode AE, a pixel defining layer PDL may be formed on the substrate SUB to expose an upper surface of the first electrode AE. An emission layer EML may be disposed on the exposed surface of the first electrode AE, and a second electrode CE may be disposed on the emission layer EML and the pixel defining layer PDL.

Figure 11:
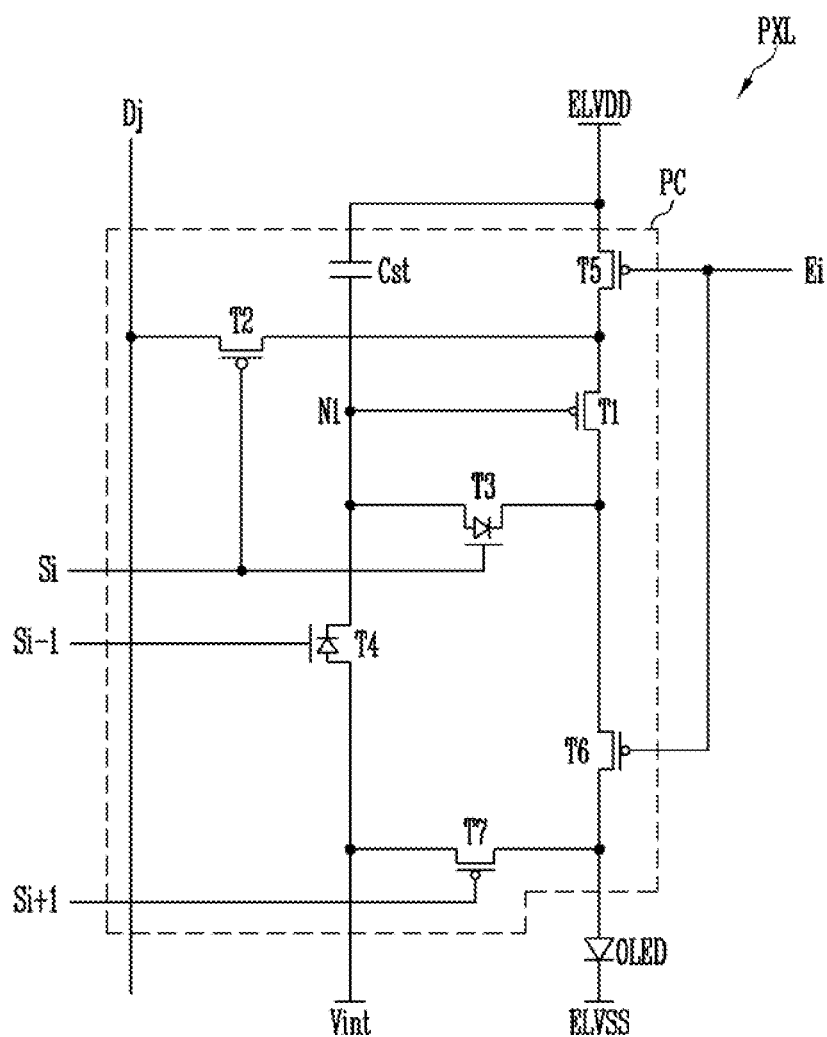
FIG. 11 is an equivalent circuit diagram illustrating a pixel in accordance with an embodiment of the present disclosure.
Figure 12:
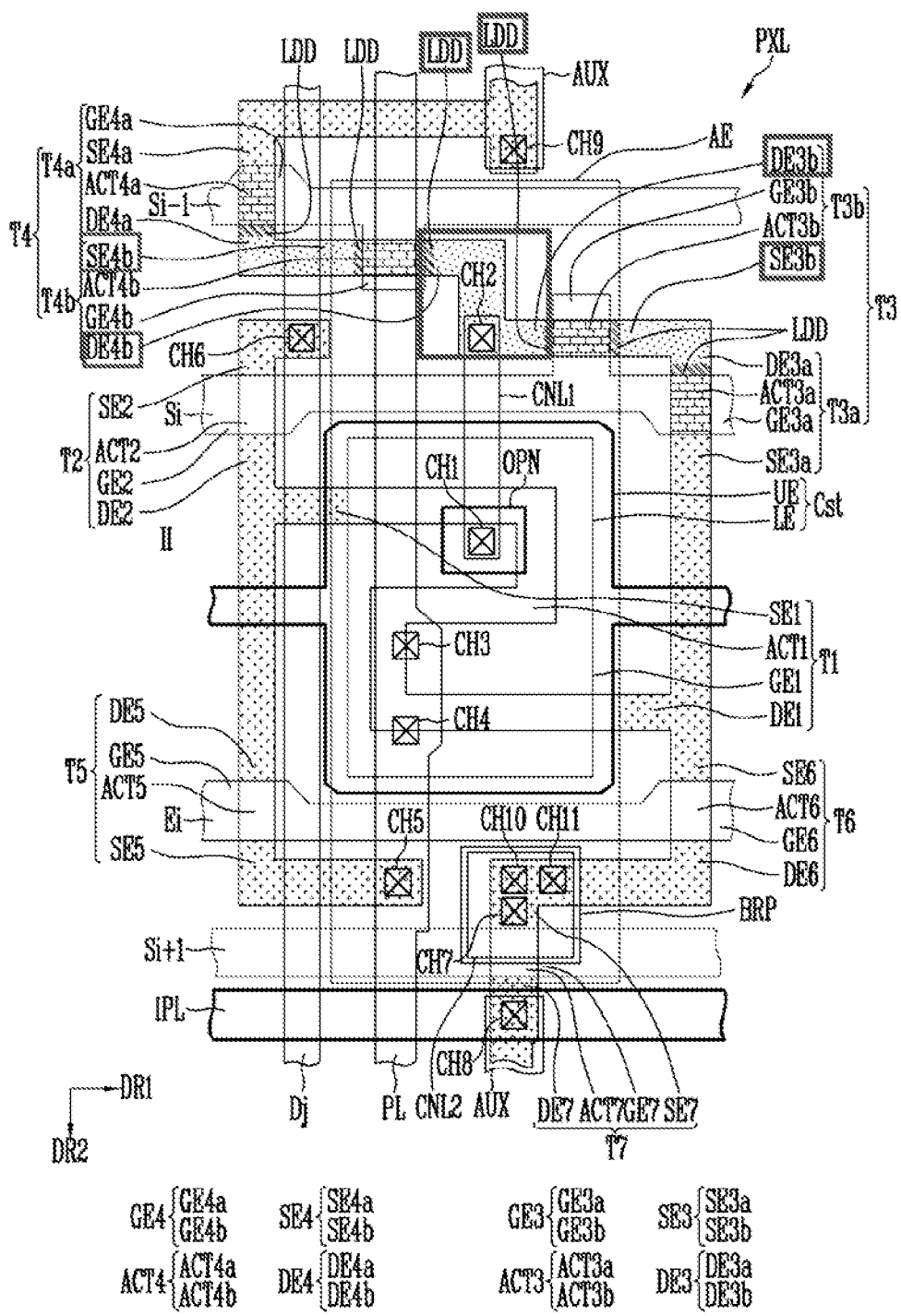
FIG. 12 is a plan view illustrating in detail one pixel shown in FIG. 11.

Referring to FIGS. 1 to 10O, the thin film encapsulation layer TFE is formed on the substrate SUB on which the light emitting element OLED is formed, FIG. 11 is an equivalent circuit diagram illustrating a pixel in accordance with an embodiment of the present disclosure, and FIG. 12 is a plan view illustrating in detail one pixel shown in FIG. 11.

The pixel illustrated in FIGS. 11 and 12 may be substantially equal or similar in configuration to the pixel illustrated in FIGS. 5 and 6 except that the pixel of FIGS. 11 and 12 is configured such that the third transistor T3 as well as the fourth transistor T4 is the tunneling field effect transistor.

Therefore, to avoid redundant explanation, the description of the pixel of FIGS. 11 and 12 will be focused on differences from that of the foregoing embodiments. Components which are not separately explained in the following description of the present embodiment may comply with that of the foregoing embodiments.

Referring to FIGS. 11 to 12, the pixel PXL in accordance with an embodiment of the present disclosure may include a light emitting element OLED, and a pixel circuit PC configured to drive the light emitting element OLED. The pixel circuit PC may include first to seventh transistors T1 to T7, and a storage capacitor Cst.

In an embodiment of the present disclosure, the first and second transistors T1 and T2 and the fifth to seventh transistors T5 to T7 may be P-type transistors, and the third and fourth transistors T3 and T4 may be tunneling field effect transistors.

The third transistor T3 may have a double gate structure to prevent the leakage of current and may include 3a-th and 3b-th transistors T3a and T3b.

The 3a-th transistor T3a may include a 3a-th active pattern ACT3a, 3a-th gate electrode GE3a, a 3a-th source electrode SE3a, and a 3a-th drain electrode DE3a. Here, the 3a-th source electrode SE3a may be formed of a semiconductor layer doped with a high concentration of p-type impurities, and the 3a-th drain electrode DE3a may be formed of a semiconductor layer doped with a high concentration of n-type impurities. Furthermore, the 3a-th active pattern ACT3a may be formed of an undoped semiconductor layer or a semiconductor layer doped with a low concentration of p-type impurities. Furthermore, the 3a-th transistor T3a may further include a lightly doped region LDD provided between the 3a-th active pattern ACT3a and the 3a-th drain electrode DE3a.

The 3b-th transistor T3b may include a 3b-th active pattern ACT3b, a 3b-th gate electrode GE3b, a 3b-th source electrode SE3b, and a 3b-th drain electrode DE3b. Here, the 3b-th source electrode SE3b may be formed of a semiconductor layer doped with a high concentration of p-type impurities, and the 3b-th drain electrode DE3b may be formed of a semiconductor layer doped with a high concentration of n-type impurities. Furthermore, the 3b-th active pattern ACT3b may be formed of an undoped semiconductor layer or a semiconductor layer doped with a low concentration of p-type impurities. Furthermore, the 3b-th transistor T3b may further include a lightly doped region LDD provided between the 3b-th active pattern ACT3b and the 3b-th drain electrode DE3b. The 3a-th drain electrode DE3a and the 3b-th source electrode SE3b may be integral with each other.

The third transistor T3 including the 3a-th and 3b-th transistors T3a and T3b may be formed of the tunneling field effect transistor including the third source electrode SE3 (or the 3a-th source electrode SE3a) that is formed of the semiconductor layer doped with a high concentration of p-type impurities, the third drain electrode DE3 (or the 3a-th and 3b-th drain electrodes DE3a and DE3b) that is formed of the semiconductor layer doped with a high concentration of n-type impurities, the third active pattern ACT3 formed of an intrinsic semiconductor layer or a semiconductor layer doped with a low concentration of p-type impurities, and the third gate electrode GE3 provided on the third active pattern ACT3 with the gate insulating layer GI (see FIG. 7) being interposed therebetween.

The fourth transistor T4 may have a double gate structure to prevent the leakage of current, and may include 4a-th and 4b-th transistors T4a and T4b.

The 4a-th transistor T4a may include a 4a-th active pattern ACT4a, a 4a-th gate electrode GE4a, a 4a-th source electrode SE4a, and a 4a-th drain electrode DE4a. Here, the 4a-th source electrode SE4a may be formed of a semiconductor layer doped with a high concentration of p-type impurities, and the 4a-th drain electrode DE4a may be formed of a semiconductor layer doped with a high concentration of n-type impurities. Furthermore, the 4a-th active pattern ACT4a may be formed of an undoped semiconductor layer or a semiconductor layer doped with a low concentration of p-type impurities. Furthermore, the 4a-th transistor T4a may further include a lightly doped region LDD provided between the 4a-th active n ACT4a and the 4a-th drain electrode DE4a.

The 4b-th transistor T4b may include a 4b-th active pattern ACT4b, a 4b-th gate electrode GE4b, a 4b-th source electrode SE4b, and the 4b-th drain electrode DE4b. Here, the 4b-th source electrode SE4b may be formed of a semiconductor layer doped with a high concentration of n-type impurities, and the 4b-th drain electrode DE4b may be formed of a semiconductor layer doped with a high concentration of n-type impurities. Furthermore, the 4b-th active pattern ACT4b may be formed of an undoped semiconductor layer or a semiconductor layer doped with a low concentration of p-type impurities. Furthermore, the 4b-th transistor T4b may further include a lightly doped region LDD provided between the 4b-th active pattern ACT4b and the 4b-th drain electrode DE4b. The 4a-th drain electrode DE4a and the 4b-th source electrode SE4b may be integral with each other.

The fourth transistor T4 including the 4a-th and 4b-th transistors T4a and T4b may be formed of the tunneling field effect transistor including the fourth source electrode SE4 (or the 4a-th source electrode SE4a) that is formed of the semiconductor layer doped with a high concentration of p-type impurities, the fourth drain electrode DE4 (or the 4a-th and 4b-th drain electrodes DE4a and DE4b) that is formed of the semiconductor layer doped with a high concentration of n-type impurities, the fourth active pattern ACT4 formed of an intrinsic semiconductor layer or a semiconductor layer doped with a low concentration of p-type impurities, and the fourth gate electrode GE4 provided on the fourth active pattern ACT4 with the gate insulating layer GI being interposed therebetween.

As described above, when the third and fourth transistors T3 and T4 are formed of tunneling field effect transistors, the leakage current of the corresponding transistor is minimized, due to the excellent off-current characteristics of the tunneling field effect transistor, so that the electrical characteristics of the corresponding transistor can be improved.

According to an embodiment of the present disclosure, the seventh transistor T7 may also be formed of the tunneling field effect transistor, thus minimizing the leakage current that flows from the initialization power line IPL to the light emitting element OLED When the seventh transistor T7 is formed of the tunneling field effect transistor, either of the seventh source electrode SE7 or the seventh drain electrode DE7 may be doped with a high concentration of n-type impurities, and the remaining electrode may be doped with a high concentration of p-type impurities.

While various exemplary embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims.

The invention claimed is:

1. A pixel, comprising:
   a light emitting element;
   a first transistor connected between a first node and the light emitting element to control current flowing from a first driving power source through the light emitting element to a second driving power source;
   a second transistor connected between a data line and the first transistor, and turned on in response to a first scan signal;
   a third transistor connected between the first transistor and the first node, and turned on in response to the first scan signal; and
   a fourth transistor connected between an initialization power line and the first node, and turned on in response to a second scan signal,
   wherein the fourth transistor is a tunneling field effect transistor comprising a source area and a drain area that are spaced apart from each other and have opposite conductivities, a channel area provided between the source area and the drain area, and a gate electrode provided on the channel area with a gate insulating layer interposed therebetween,
   wherein the gate electrode of the fourth transistor comprises a lower surface provided on the gate insulating layer, an upper surface facing the lower surface, and first and second side surfaces coupling the lower surface and the upper surface,
   wherein the first and second side surfaces have different tapered shapes.

2. The pixel according to claim 1, wherein the source area of the fourth transistor includes p-type impurities, and the drain area of the fourth transistor includes n-type impurities.

3. The pixel according to claim 2,
   wherein the fourth transistor comprises a lightly doped region provided between the drain area and the channel area, and wherein the lightly doped region includes n-type impurities having a concentration lower than that of the drain area.

4. The pixel according to claim 3,
wherein the first side surface extends from a boundary point between the lightly doped region and the channel area to a side of the upper surface with a first inclination, and the second side surface extends from a boundary point between the channel area and the source area to the other side of the upper surface with a second inclination, and
wherein the first inclination and the second inclination are different from each other.

5. The pixel according to claim 4, wherein the second inclination is greater than the first inclination.

6. The pixel according to claim 5,
wherein the gate insulating layer includes a first pan corresponding to the drain area and the lightly doped region, and a second part corresponding to the channel area and the source area, and
wherein a thickness of the second part is thicker than that of the first part.

7. The pixel according to claim 1, wherein the third transistor is a tunneling field effect transistor.

8. The pixel according to claim 1, further comprising:
a fifth transistor connected between the first transistor and the first driving power source, and turned off when an emission control signal is supplied to an emission control line;
a sixth transistor connected between the first transistor and the light emitting element, and turned off when the emission control signal is supplied to the emission control line; and
a seventh transistor connected between the initialization power line and the light emitting element.

9. The pixel according to claim 8, wherein the first, second,
third, fifth, sixth, and seventh transistors are P-type thin film transistors.

10. A display device, comprising:
a substrate including a display area and a non-display area;
pixels coupled to scan lines, emission control lines, and data lines, and located in the display area of the substrate; and
a driver configured to drive the scan lines, the emission control lines, and the data lines,
wherein at least one pixel among the pixels comprises:
a light emitting element;
a first transistor connected between a first node and the light emitting element to control current flowing from a first driving power source through the light emitting element to a second driving power source;
a second transistor connected between a data line and the first transistor, and turned on in response to a first scan signal;
a third transistor connected between the first transistor and the first node, and turned on in response to the first scan signal; and
a fourth transistor connected between an initialization power and the first node, and turned on in response to a second scan signal,
wherein the fourth transistor is a tunneling field effect transistor comprising a source area and a drain area that are spaced apart from each other and have opposite conductivities, a channel area provided between the source area and the drain area, and a gate electrode provided on the channel area with a gate insulating layer interposed therebetween,
wherein the gate electrode of the fourth transistor comprises a lower surface provided on the gate insulating layer, an upper surface facing the lower surface, and first and second side surfaces coupling the lower surface and the upper surface,
wherein the first and second side surfaces have different tapered shapes.

11. The display device according to claim 10, wherein the source area of the fourth transistor includes p-type impurities, and the drain area of the fourth transistor includes n-type impurities.

12. The display device according to claim 11,
wherein the fourth transistor comprises a lightly doped region provided between the drain area and the channel area, and
wherein the lightly doped region includes n-type impurities having a concentration lower than that of the drain area.

13. The display device according to claim 12,
wherein the first side surface extends from a boundary point between the lightly doped region and the channel area to a side of the upper surface with a first inclination, and the second side surface extends from a boundary point between the channel area and the source area to the other of the upper surface with a second inclination, and
wherein the first inclination and the second inclination are different from each other.

14. The display device according to claim 13, wherein the second inclination is greater than the first inclination.

15. The display device according to claim 14,
wherein the gate insulating layer includes a first part corresponding to the drain area and the lightly doped region, and a second part corresponding to the channel area and the source area, and
wherein a thickness of the second part is thicker than that of the first part.

16. The display device according to claim 11, wherein the pixel comprises:
a fifth transistor connected between the first transistor and the first driving power source, and turned off when an emission control signal is supplied to an emission control line;
a sixth transistor connected between the first transistor and the light emitting element, and turned off when the emission control signal is supplied to the emission control line; and
a seventh transistor connected between the initialization power line and the light emitting element, and turned on in response to a third scan signal,
wherein the first, second, third, fifth, sixth and seventh transistors are P-type thin film transistors.

17. A method of manufacturing a display device, comprising:
forming a semiconductor pattern on a substrate, and then forming a channel area of at least one transistor in the semiconductor pattern;
sequentially stacking a gate insulating layer and a conductive layer on the semiconductor pattern;
forming a first photosensitive pattern including a first opening on the conductive layer, and then removing a portion of the conductive layer corresponding to the first opening to form a conductive pattern and expose a portion of the gate insulating layer;

doping a first concentration of n-type impurities using the first photosensitive pattern and the conductive pattern as a mask to form a first doping area adjacent to a side of the channel area in the semiconductor pattern;

removing a part of each of the first photosensitive pattern and the conductive pattern by performing an ashing process, and then doping a part of an area of the semiconductor pattern adjacent to the first doping area with a second concentration of n-type impurities to form a second doping area adjacent to the first doping area;

forming a second photosensitive pattern that covers the first and second doping areas and a portion of the conductive pattern adjacent to the second doping area, and then patterning the portion of the conductive pattern using the second photosensitive pattern as a mask to form a gate pattern; and doping a first concentration of p-type impurities using the second photosensitive pattern and the gate pattern as a mask to form a third doping area adjacent to the other side of the channel area in the semiconductor pattern.

18. The method according to claim 17,
wherein the gate pattern comprises a gate electrode of the transistor including a lower surface in contact with the gate insulating layer, an upper surface facing the lower surface, and first and second side surfaces coupling the lower surface and the upper surface,
wherein the first side surface extends from a boundary point between the second doping area and the channel area to a side of the upper surface with a first inclination, and the second side surface extends from a boundary point between the channel area and the third doping area to the other side of the upper surface with a second inclination, and
wherein the first inclination and the second inclination are different from each other, and the second inclination is greater than the first inclination.

19. The method according to claim 18, wherein, in the ashing process, a portion of the exposed gate insulating layer is partially etched, so that a thickness of the gate insulating layer corresponding to the first doping area is different from that of the gate insulating layer corresponding to the third doping area.

20. The method according to claim 18, wherein the transistor is a tunneling field effect transistor comprising the first doping area and the third doping area that are spaced apart from each other and have opposite conductivities, the channel area, the second doping area formed between the first doping area and the channel area, and the gate electrode formed on the channel area with the gate insulating layer interposed therebetween.

21. A pixel, comprising:
a light emitting element;
a first transistor connected between a first node and the light emitting element to provide a current from a first driving power source to the light emitting element;
a second transistor connected between a data line and the first transistor, and connected to a first scan line;
a third transistor connected between the first transistor and the first node, and connected to the first scan line; and
a fourth transistor connected between an initialization power line and the first node, and connected to a second scan line,
wherein the fourth transistor is a tunneling field effect transistor,
wherein a thickness of a gate insulating layer on a first electrode of the fourth transistor is less than a thickness of the gate insulating layer on a second electrode of the fourth transistor.

22. The pixel of claim 21, wherein the gate insulating layer is disposed between a gate electrode and a channel area of the fourth transistor, the gate electrode having first and second sides with different slopes.

23. The pixel of claim 22, wherein the first slope is less than the second slope.

* * * * *